(12) United States Patent  
Miyazaki et al.

(10) Patent No.: US 7,956,444 B2  
(45) Date of Patent: Jun. 7, 2011

(54) SEMICONDUCTOR DEVICE HAVING ELECTRODE PAD, AND WIRELESS CIRCUIT DEVICE INCLUDING THE SEMICONDUCTOR DEVICE

(75) Inventors: Takahito Miyazaki, Kyoto (JP); Shinichiro Uemura, Osaka (JP)

(73) Assignee: Panasonic Corporation, Osaka (JP)

( * ) Notice: Subject to any disclaimer, the term of this patent is extended or adjusted under 35 U.S.C. 154(b) by 143 days.

(21) Appl. No.: 12/526,910

(22) PCT Filed: Dec. 17, 2008

(86) PCT No.: PCT/JP2008/003822  
§ 371 (c)(1),  
(2), (4) Date: Aug. 12, 2009

(87) PCT Pub. No.: WO2009/107182  
PCT Pub. Date: Sep. 3, 2009

(65) Prior Publication Data  
US 2010/0134183 A1      Jun. 3, 2010

(30) Foreign Application Priority Data

Feb. 28, 2008    (JP) ................................ 2008-048003

(51) Int. Cl.  
*H01L 23/552* (2006.01)
(52) U.S. Cl. .................. 257/659; 257/508; 257/E23.114
(58) Field of Classification Search .................. 257/659, 257/508, E23.114  
See application file for complete search history.

(56) References Cited

U.S. PATENT DOCUMENTS

| 4,803,541 | A | 2/1989 | Kouda |
| 4,855,257 | A | 8/1989 | Kouda |
| 6,104,094 | A | 8/2000 | Ban et al. |
| 7,550,850 | B2 * | 6/2009 | Nakashiba ................... 257/758 |
| 2005/0249005 | A1 | 11/2005 | Nakamoto et al. |
| 2008/0099886 | A1 * | 5/2008 | Kadoyama et al. ........... 257/659 |

FOREIGN PATENT DOCUMENTS

| JP | 07-106524 | 4/1995 |
| JP | 2000-299319 | 10/2000 |
| JP | 2004-179255 | 6/2004 |
| JP | 2005-322750 | 11/2005 |

* cited by examiner

*Primary Examiner* — Long Pham  
(74) *Attorney, Agent, or Firm* — McDermott Will & Emery LLP

(57) ABSTRACT

A semiconductor device includes a layered region (104) formed in a semiconductor substrate (101) of a first conductivity type, and an electrode pad (106) formed on the semiconductor substrate with an interlayer insulating film (105) interposed therebetween and placed above the layered region. The layered region includes a first impurity diffusion region (102), a second impurity diffusion region (103) formed on the first impurity diffusion region, and a third impurity diffusion region (102x) formed on the first impurity diffusion region and surrounding a periphery of the second impurity diffusion region. a conductivity type of the first impurity diffusion region and a conductivity type of the third impurity diffusion region are a second conductivity type, and a conductivity type of the second impurity diffusion region is the first conductivity type. An impurity concentration of the third impurity diffusion region is higher than an impurity concentration of the first impurity diffusion region, and the third impurity diffusion region is electrically connected to a terminal fixed to a constant potential.

17 Claims, 12 Drawing Sheets

(a)

(b)

(a)

(b)

(a)

(b)

(a)

(b)

(a)

(b)

(a)

(b)

(a)

(b)

(a)

(b)

(a)

(b)

SEMICONDUCTOR DEVICE HAVING ELECTRODE PAD, AND WIRELESS CIRCUIT DEVICE INCLUDING THE SEMICONDUCTOR DEVICE

RELATED APPLICATIONS

This application is the U.S. National Phase under 35 U.S.C. §371 of International Application No. PCT/JP2008/003822, filed on Dec. 17, 2008, which in turn claims the benefit of Japanese Application No. 2008-048003, filed on Feb. 28, 2008, the disclosures of which Applications are incorporated by reference herein.

TECHNICAL FIELD

The present invention relates to a semiconductor device having an electrode pad, and a wireless circuit device including the same.

BACKGROUND ART

With a semiconductor device in which a plurality of types of signal circuits, including a digital signal circuit, an analog signal circuit and a high-frequency signal circuit, are integrated together within a single IC chip, such as a system-on-chip (SOC), the device characteristics deteriorate due to interactions between these circuit blocks and interactions between these circuit blocks and the input (or output) electrode pad. Among others, a particularly significant problem is the deterioration of device characteristics due to switching noise from a digital switch circuit ("switching noise" refers to high-frequency noise generated by the switching of an electronic circuit) propagating to the electrode pad via a semiconductor substrate made of silicon.

As an example, in a case of a semiconductor device including an attenuation circuit connected downstream of a digital switch circuit and an output electrode pad connected downstream of the attenuation circuit, switching noise from the digital switch circuit propagates to the output electrode pad via a semiconductor substrate included in the semiconductor device, thereby lowering the quality of the signal output from the output electrode pad (detracting from the amount of attenuation obtained by the attenuation circuit).

Moreover, in recent years, as semiconductor devices are miniaturized, the distance between an electrode pad and a device under the electrode pad is shortened, thereby increasing the parasitic capacitance between the electrode pad and the device under the electrode pad, and increasing the amount of noise propagation to the electrode pad via the semiconductor substrate.

A technique as follows (see, for example, Patent Document 1) has been proposed as a measure for suppressing the propagation of noise to the electrode pad via the semiconductor substrate. The configuration of a conventional semiconductor device will be described with reference to FIGS. 12(a) and 12(b). FIGS. 12(a) and 12(b) show the configuration of the conventional semiconductor device, and specifically, FIG. 12(a) is a plan view, and FIG. 12(b) is a cross-sectional view taken along line XII-XII shown in FIG. 12(a).

As shown in FIGS. 12(a) and 12(b), an electrode pad 806 is formed in an area on an insulating film 805 on a semiconductor substrate 801 where there is no device (not shown). A metal layer (or silicide layer) 815 having about the same area as that of the electrode pad 806 is formed in the insulating film 805 under the electrode pad 806. The metal layer (or silicide layer) 815 is electrically connected to a wire 808, which is fixed to a constant potential. With the conventional semiconductor device, the metal layer (or silicide layer) 815 is kept at a constant potential during operation in an attempt to suppress the propagation of noise to the electrode pad 806 via the semiconductor substrate 801.

Patent Document 1: Japanese Published Patent Application No. 2000-299319

DISCLOSURE OF THE INVENTION

Problems to be Solved by the Invention

However, the conventional semiconductor device has a problem as follows.

Since the metal layer (or silicide layer) 815, which is fixed to a constant potential, is provided between the semiconductor substrate 801 and the electrode pad 806, as shown in FIG. 12(b), a parasitic capacitance is formed between the metal layer (or silicide layer) 815 and the electrode pad 806, and a high-frequency signal, which is supposedly passed, is attenuated due to an influence of the parasitic capacitance formed, thus resulting in a deterioration of the device characteristics.

As described above, the conventional technique results in a deterioration of the device characteristics. Particularly, if the electrode pad of the conventional semiconductor device is used as an electrode pad for use in a mobile communication device such as a mobile telephone, i.e., as an electrode pad through which a high-frequency signal of a GHz band or higher is input (or output), it will result in a significant deterioration of the device characteristics.

In view of the above, an object of the present invention is to suppress the propagation of noise to the electrode pad via the semiconductor substrate without resulting in a deterioration of the device characteristics.

Means for Solving the Problems

In order to achieve the object set forth above, a semiconductor device of the present invention is a semiconductor device including: a layered region formed in a semiconductor substrate of a first conductivity type; and an electrode pad formed on the semiconductor substrate with an interlayer insulating film interposed therebetween and placed above the layered region, wherein the layered region includes: a first impurity diffusion region; a second impurity diffusion region formed on the first impurity diffusion region; and a third impurity diffusion region formed on the first impurity diffusion region and surrounding a periphery of the second impurity diffusion region, a conductivity type of the first impurity diffusion region and a conductivity type of the third impurity diffusion region are a second conductivity type, a conductivity type of the second impurity diffusion region is the first conductivity type, an impurity concentration of the third impurity diffusion region is higher than an impurity concentration of the first impurity diffusion region, and the third impurity diffusion region is electrically connected to a terminal fixed to a constant potential.

With the semiconductor device of the present invention, by providing the layered region in a region of the semiconductor substrate under the electrode pad, it is possible to form pn junction surfaces in series with each other between the semiconductor substrate and the electrode pad. Thus, since the number of parasitic capacitances (in other words, stray capacitances) connected in series with one another that are included between the semiconductor substrate and the electrode pad can be increased, it is possible to reduce the combined capacitance between the semiconductor substrate and the electrode pad and to suppress the propagation of noise to the electrode pad via the semiconductor substrate.

In addition, by electrically connecting the third impurity diffusion region to the terminal fixed to the constant potential, noise propagating to the third impurity diffusion region via the semiconductor substrate can be shunted to the terminal fixed to the constant potential, and by forming the first impurity diffusion region under the third impurity diffusion region so that it is in contact with the third impurity diffusion region, noise propagating to the first impurity diffusion region via the semiconductor substrate can be shunted to the terminal fixed to the constant potential through the third impurity diffusion region. Thus, it is possible to further suppress the propagation of noise to the electrode pad via the semiconductor substrate.

Moreover, by setting the impurity concentration of the third impurity diffusion region higher than the impurity concentration of the first impurity diffusion region, noise propagating to the first impurity diffusion region via the semiconductor substrate can be effectively shunted to the terminal fixed to the constant potential through the third impurity diffusion region, which has a lower impedance than that of the first impurity diffusion region. Thus, it is possible to further suppress the propagation of noise to the electrode pad via the semiconductor substrate.

Therefore, it is possible to prevent a deterioration of the device characteristics, thus realizing a semiconductor device with high performance and high reliability.

In the semiconductor device of the present invention, it is preferred that the semiconductor device further includes: a wire formed in the interlayer insulating film and electrically connected to the terminal, wherein the third impurity diffusion region is electrically connected to the wire, and the wire is placed in an area outside a formation area of the electrode pad.

Then, the electrode pad and the wire will not overlap with each other as viewed from a direction perpendicular to the principal plane of the semiconductor substrate. Thus, it is possible to give a potential from outside to the third impurity diffusion region without forming an unnecessary parasitic capacitance due to an overlap between the electrode pad and the wire.

In the semiconductor device of the present invention, it is preferred that the semiconductor device further includes: an insulating film formed in the semiconductor substrate and surrounding a periphery of the layered region.

Then, it is possible to newly provide a parasitic capacitance at the interface between the semiconductor substrate and the outer periphery surface of the insulating film and to newly provide a parasitic capacitance at the interface between the semiconductor substrate and the inner periphery surface of the insulating film, and it is therefore possible to further increase the number of parasitic capacitances connected in series with one another that are included between the semiconductor substrate and the electrode pad. Thus, it is possible to further reduce the combined capacitance between the semiconductor substrate and the electrode pad, and to further suppress the propagation of noise to the electrode pad via the semiconductor substrate.

In the semiconductor device of the present invention, it is preferred that the semiconductor device further includes: a conductive film formed in the semiconductor substrate and surrounding a periphery of the layered region.

Then, it is possible to suppress the entry of noise propagating via the semiconductor substrate into the layered region, and it is therefore possible to further suppress the propagation of noise to the electrode pad via the semiconductor substrate.

In the semiconductor device of the present invention, it is preferred that the conductive film is electrically connected to a conductive film terminal fixed to a constant potential.

Then, noise propagating to the conductive film via the semiconductor substrate can be shunted to the conductive film terminal, and it is therefore possible to further suppress the propagation of noise to the electrode pad via the semiconductor substrate.

In the semiconductor device of the present invention, it is preferred that the semiconductor device further includes: a wire formed in the interlayer insulating film and electrically connected to the terminal, wherein the third impurity diffusion region is electrically connected to the wire; and the wire is placed in an area outside a formation area of the electrode pad.

Then, the electrode pad and the wire will not overlap with each other as viewed from a direction perpendicular to the principal plane of the semiconductor substrate. Thus, it is possible to give a potential from outside to the third impurity diffusion region without forming an unnecessary parasitic capacitance due to an overlap between the electrode pad and the wire.

In the semiconductor device of the present invention, it is preferred that a potential of the third impurity diffusion region is a first potential, and a potential of the conductive film is a second potential different from the first potential.

In the semiconductor device of the present invention, it is preferred that the semiconductor device further includes: detection means for detecting a noise signal leaking from the conductive film; control means for controlling a potential of the third impurity diffusion region to be at the first potential based on the noise signal detected by the detection means; and control means for controlling a potential of the conductive film to be at the second potential based on the noise signal detected by the detection means.

Then, by controlling the potential of the conductive film and the potential of the third impurity diffusion region separately from each other, an anti-noise signal having a reverse phase with respect to a noise signal leaking from the conductive film can be added to the noise signal propagating to the first and third impurity diffusion regions from the conductive film to cancel out the noise signal and the anti-noise signal by each other. Thus, it is possible to further suppress the propagation of a noise signal to the electrode pad via the semiconductor substrate.

In the semiconductor device of the present invention, it is preferred that the electrode pad is an input electrode pad or an output electrode pad.

In the semiconductor device of the present invention, it is preferred that the semiconductor device further includes: a digital switch circuit; and an attenuation circuit, wherein the attenuation circuit is connected downstream of the digital switch circuit, and the electrode pad is connected downstream of the attenuation circuit.

Then, it is possible to suppress the propagation of the switching noise from the digital switch circuit to the electrode pad via the semiconductor substrate. Therefore, it is possible to ensure a high signal quality, while avoiding a deterioration of the signal quality due to the switching noise (the noise signal) propagating to the electrode pad to interfere with (or to be superimposed on) the signal output from the electrode pad. Since it is possible to sufficiently ensure an isolation between the digital switch circuit and the electrode pad, the amount of attenuation of the attenuation circuit will not be detracted from.

In the semiconductor device of the present invention, it is preferred that the semiconductor device further includes: a digital switch circuit; and an amplification circuit, wherein the amplification circuit is connected downstream of the digital switch circuit, and the electrode pad is connected downstream of the amplification circuit.

Then, it is possible to suppress the propagation of the switching noise from the digital switch circuit to the electrode pad via the semiconductor substrate. Therefore, it is possible to ensure a high signal quality, while avoiding a deterioration of the signal quality due to the switching noise (the noise signal) propagating to the electrode pad to interfere with (or to be superimposed on) the signal output from the electrode pad.

In order to achieve the object set forth above, a wireless circuit device of the present invention includes: the semiconductor device of the present invention; an amplifier connected to the semiconductor device of the present invention and receiving a signal from the electrode pad; and an antenna connected to the amplifier and transmitting to outside a signal from the amplifier in the form of a radio wave.

With the wireless circuit device of the present invention, the signal output from the electrode pad has a high signal quality, and it is therefore possible to provide a wireless circuit device with high reliability.

In order to achieve the object set forth above, an electrode pad of the present invention is an electrode pad formed on a semiconductor substrate of a first conductivity type with an interlayer insulating film interposed therebetween, wherein the electrode pad is placed above a layered region formed in the semiconductor substrate, the layered region includes a first impurity diffusion region, a second impurity diffusion region formed on the first impurity diffusion region, and a third impurity diffusion region formed on the first impurity diffusion region and surrounding a periphery of the second impurity diffusion region, a conductivity type of the first impurity diffusion region and a conductivity type of the third impurity diffusion region are a second conductivity type, a conductivity type of the second impurity diffusion region is the first conductivity type, an impurity concentration of the third impurity diffusion region is higher than an impurity concentration of the first impurity diffusion region, and the third impurity diffusion region is electrically connected to a terminal fixed to a constant potential.

With the electrode pad of the present invention, the propagation of noise via the semiconductor substrate is suppressed, and it is therefore possible to realize an electrode pad with high reliability.

EFFECTS OF THE INVENTION

As described above, according to the present invention, by providing the layered region in a region of the semiconductor substrate under the electrode pad, it is possible to form pn junction surfaces in series with each other between the semiconductor substrate and the electrode pad. Thus, since the number of parasitic capacitances (in other words, stray capacitances) connected in series with one another that are included between the semiconductor substrate and the electrode pad can be increased, it is possible to reduce the combined capacitance between the semiconductor substrate and the electrode pad and to suppress the propagation of noise to the electrode pad via the semiconductor substrate. In addition, by electrically connecting the third impurity diffusion region to the terminal fixed to the constant potential, noise propagating to the third impurity diffusion region via the semiconductor substrate can be shunted to the terminal fixed to the constant potential, and by forming the first impurity diffusion region under the third impurity diffusion region so that it is in contact with the third impurity diffusion region, noise propagating to the first impurity diffusion region via the semiconductor substrate can be shunted to the terminal fixed to the constant potential through the third impurity diffusion region. Thus, it is possible to further suppress the propagation of noise to the electrode pad via the semiconductor substrate. Moreover, by setting the impurity concentration of the third impurity diffusion region higher than the impurity concentration of the first impurity diffusion region, noise propagating to the first impurity diffusion region via the semiconductor substrate can be effectively shunted to the terminal fixed to the constant potential through the third impurity diffusion region, which has a lower impedance than that of the first impurity diffusion region. Thus, it is possible to further suppress the propagation of noise to the electrode pad via the semiconductor substrate. Therefore, it is possible to prevent a deterioration of the device characteristics, thus realizing a semiconductor device with high performance and high reliability.

DESCRIPTION OF REFERENCE NUMERALS

Figure 1:
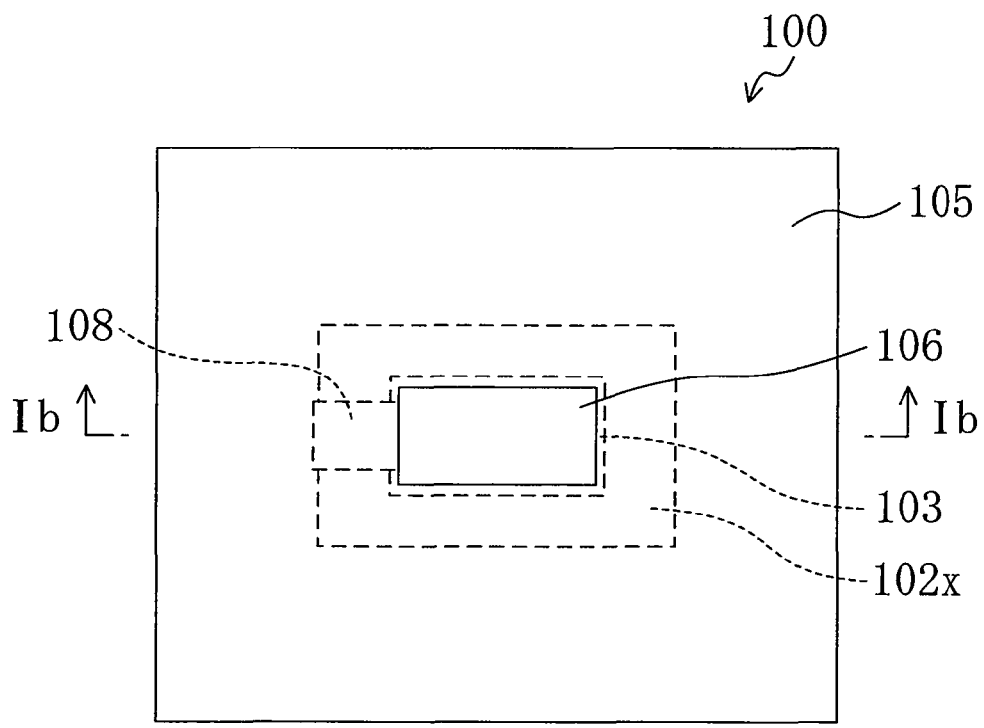
FIG. 1(a) and FIG. 1(b) show a configuration of a semiconductor device according to a first embodiment of the present invention.
Figure 1:
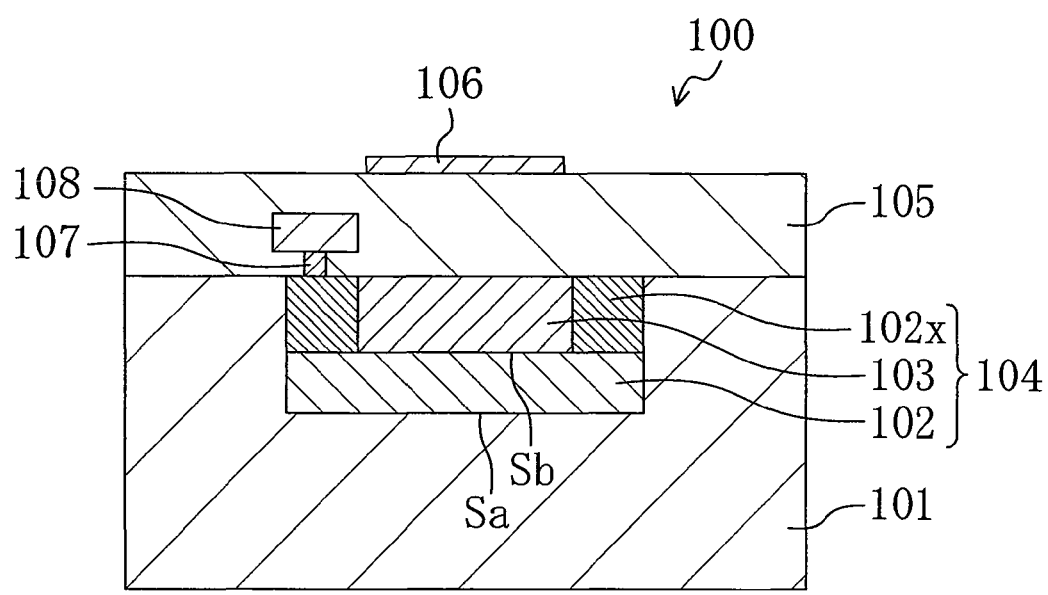

100 Semiconductor device
101 Semiconductor substrate

102 First impurity diffusion region
103 Second impurity diffusion region
102x Third impurity diffusion region
104 Layered region
105 Interlayer insulating film
106 Electrode pad
107 Contact plug
108 Wire
200 Semiconductor device
201 Semiconductor substrate
202 First impurity diffusion region
203 Second impurity diffusion region
202x Third impurity diffusion region
204 Layered region
300 Semiconductor device
309 Insulating film
309t Trench
400 Semiconductor device
410 Conductive film
410t Trench
411 Contact plug
412 Wire
500 Semiconductor device
513 Wire
514 Wire
601 Local oscillator
602 Frequency divider
603 Variable attenuation circuit
604 Driver amplifier
605 Electrode pad
606 High-frequency integrated circuit
607 High-frequency amplifier
608 Antenna
700 Semiconductor device
701 Semiconductor substrate
703 Impurity diffusion region
705 Interlayer insulating film
706 Electrode pad
Sa, Sb Pn junction surface
Ix, Iy, Iv, Iw Interface
Rv101, Rh101, Rh102, Rh103, Rv102, Rh102x Resistor
Pca, Pcb Parasitic capacitance formed at pn junction surface
Pc105 Parasitic capacitance of interlayer insulating film
Pc309 Parasitic capacitance formed at interface
Pr309 Parasitic resistor
Cr410 Contact resistor formed at interface
Pr410 Parasitic resistor
Rv701, Rh701, Rh703 Resistor
Pc705 Parasitic capacitance of interlayer insulating film

BEST MODE FOR CARRYING OUT THE INVENTION

Embodiments of the present invention will now be described with reference to the drawings.

First Embodiment

A semiconductor device according to the first embodiment of the present invention will now be described with reference to FIGS. 1(a) and 1(b) and FIGS. 2(a) and 2(b).

The configuration of the semiconductor device according to the first embodiment of the present invention will now be described with reference to FIGS. 1(a) and 1(b). FIGS. 1(a) and 1(b) show the configuration of the semiconductor device according to the first embodiment of the present invention, and specifically, FIG. 1(a) is a plan view, and FIG. 1(b) is a cross-sectional view taken along line Ib-Ib shown in FIG. 1(a).

As shown in FIGS. 1(a) and 1(b), a semiconductor device 100 of the present embodiment includes, as primary elements, a p-type (the first conductivity type) semiconductor substrate 101 made of silicon, a layered region 104 formed in the semiconductor substrate 101 including an n-type (the second conductivity type) first impurity diffusion region 102, a p-type second impurity diffusion region 103 and an n-type third impurity diffusion region 102x, an electrode pad 106 formed on the semiconductor substrate 101 with an interlayer insulating film 105 interposed therebetween and made of a conductive film placed above the layered region 104, a contact plug 107 formed in the interlayer insulating film 105 with its lower end being connected to the upper surface of the third impurity diffusion region 102x, and a wire 108 formed in the interlayer insulating film 105 with its lower surface being connected to the upper end of the contact plug 107 and electrically connected to a ground terminal (not shown).

Specifically, as shown in FIG. 1(b), the layered region 104 includes the first impurity diffusion region 102, the second impurity diffusion region 103 formed on the first impurity diffusion region 102, and the third impurity diffusion region 102x formed on the first impurity diffusion region 102 so as to cover the periphery of the second impurity diffusion region 103 while being in contact with the second impurity diffusion region 103, with the third impurity diffusion region 102x having a higher impurity concentration than that of the first impurity diffusion region 102.

As described above, as the lower surface of the second impurity diffusion region 103 is covered by the first impurity diffusion region 102 and the side surface of the second impurity diffusion region 103 is covered by the third impurity diffusion region 102x, the second impurity diffusion region 103 of the layered region 104 and the semiconductor substrate 101 are separated from each other.

With the provision of the layered region 104 in a region of the semiconductor substrate 101 under the electrode pad 106, a pn junction surface Sa is formed between the p-type semiconductor substrate 101 and the n-type first impurity diffusion region 102, and a pn junction surface Sb is formed between the n-type first impurity diffusion region 102 and the p-type second impurity diffusion region 103, wherein the two pn junction surfaces Sa and Sb are formed in series with each other between the semiconductor substrate 101 and the electrode pad 106. That is, two parasitic capacitances (in other words, stray capacitances) are placed in series with each other between the semiconductor substrate 101 and the electrode pad 106.

As the third impurity diffusion region 102x is connected, via the contact plug 107, to the wire 108, which is electrically connected to the ground terminal, the third impurity diffusion region 102x is electrically connected to the ground terminal.

As the first impurity diffusion region 102 is formed under the third impurity diffusion region 102x so that it is in contact with the third impurity diffusion region 102x, which is electrically connected to the ground terminal, the first impurity diffusion region 102 is electrically connected to the ground terminal.

As the impurity concentration of the third impurity diffusion region 102x is set higher than the impurity concentration of the first impurity diffusion region 102, the impedance of the third impurity diffusion region 102x is made lower than the impedance of the first impurity diffusion region 102.

Figure 2:
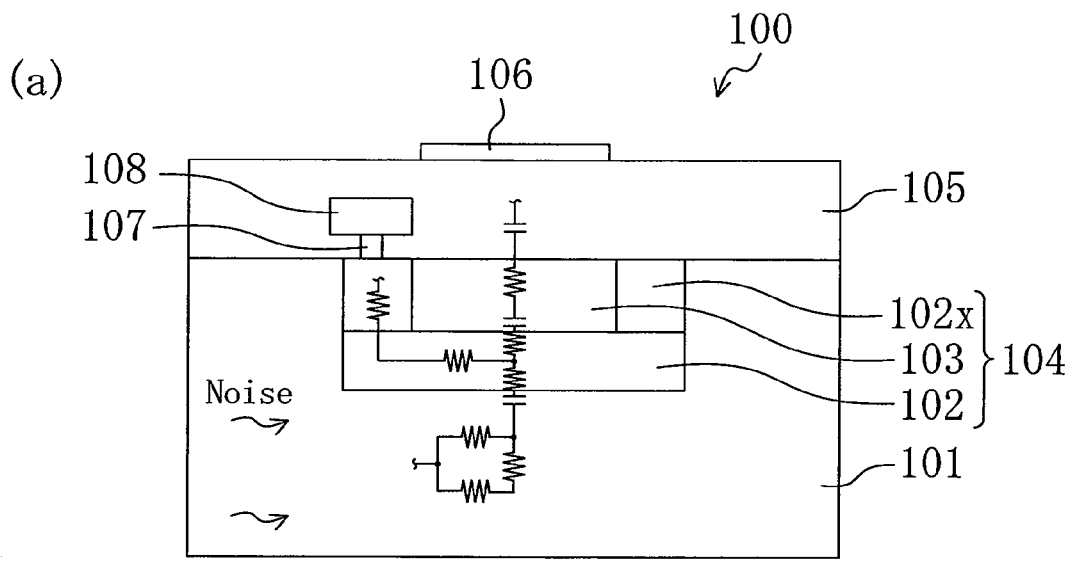
FIG. 2(a) shows parasitic capacitances and resistors formed in the semiconductor device according to the first embodiment of the present invention.
FIG. 2(b) shows an equivalent circuit of the structure of the semiconductor device according to the first embodiment of the present invention.
Figure 2:
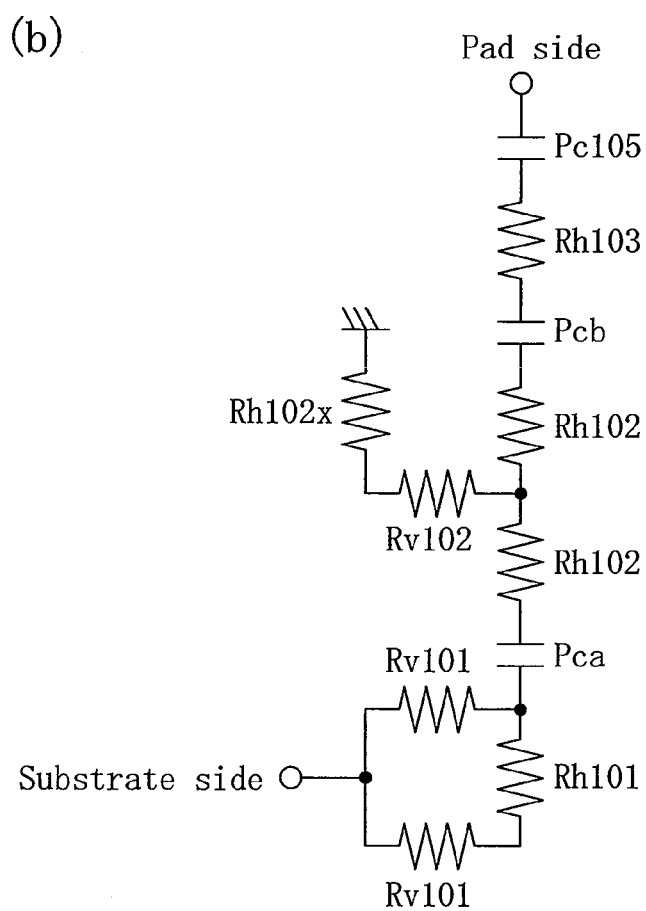

An equivalent circuit of the structure of the semiconductor device 100 according to the first embodiment of the present invention will now be described with reference to FIGS. 2(a) and 2(b). FIG. 2(a) shows parasitic capacitances and resistors formed in the semiconductor device according to the first embodiment of the present invention, and FIG. 2(b) shows an equivalent circuit of the structure of the semiconductor device according to the first embodiment of the present invention.

As shown in FIG. 2(b), the equivalent circuit of the structure of the semiconductor device 100 of the present embodiment includes, in this order from the substrate side toward the pad side, lateral resistors Rv101 of the semiconductor substrate 101, a vertical resistor Rh101 of the semiconductor substrate 101 connected between the resistors Rv101, a parasitic capacitance Pca formed at the pn junction surface Sa formed between the semiconductor substrate 101 and the first impurity diffusion region 102, vertical resistors Rh102 of the first impurity diffusion region 102, a parasitic capacitance Pcb formed at the pn junction surface Sb formed between the first impurity diffusion region 102 and the second impurity diffusion region 103, a vertical resistor Rh103 of the second impurity diffusion region 103, and a parasitic capacitance Pc105 of the interlayer insulating film 105. It further includes a lateral resistor Rv102 of the first impurity diffusion region 102 connected between the resistors Rh102, a vertical resistor Rh102x of the third impurity diffusion region 102x, and a ground terminal connected to the resistor Rh102x. Note that "vertical" as used in this specification refers to a direction that extends in the perpendicular direction to the principal plane of the semiconductor substrate 101, and "lateral" refers to a direction that extends in the horizontal direction to the principal plane of the semiconductor substrate 101.

As described above, the equivalent circuit of the structure of the semiconductor device 100 of the present embodiment includes three parasitic capacitances Pca, Pcb and Pc105 connected in series with one another between the semiconductor substrate 101 and the electrode pad 106.

Here, the combined capacitance of parasitic capacitances (in other words, stray capacitances) connected in series with one another is calculated by Expression 1 below.

$$\frac{1}{C} = \sum_{i=1}^{n} \frac{1}{Ci} \qquad \text{[Expression 1]}$$

In Expression 1, C is the combined capacitance, Ci is the capacitance of each parasitic capacitance, and n is the number of parasitic capacitances.

Specifically, where the capacitance of the parasitic capacitance Pca is denoted as Ca, the capacitance of the parasitic capacitance Pcb as Cb and the capacitance of the parasitic capacitance Pc105 as C105 in the equivalent circuit of the structure of the semiconductor device 100 of the present embodiment, for example, the combined capacitance Cx of the three parasitic capacitances Pca, Pcb and Pc105 connected in series, or in other words, the combined capacitance Cx between the semiconductor substrate 101 and the electrode pad 106, is represented by Expression 2 below.

$$\frac{1}{Cx} = \frac{1}{Ca} + \frac{1}{Cb} + \frac{1}{C105} \qquad \text{[Expression 2]}$$

In order to effectively describe the effects of the present embodiment, the magnitude relationship of the combined capacitance between the semiconductor substrate and the electrode pad of the semiconductor device of the present embodiment will be compared with that of a semiconductor device of a comparative embodiment.

Figure 3:
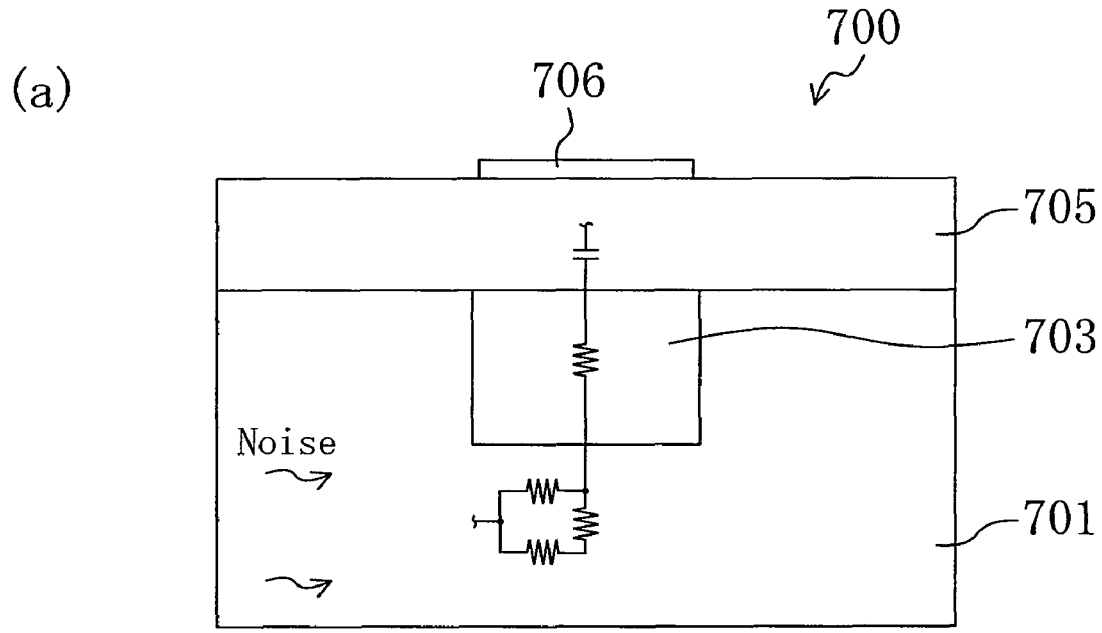
FIG. 3(a) shows parasitic capacitances and resistors formed in the semiconductor device according to a comparative embodiment.
FIG. 3(b) shows an equivalent circuit of the structure of the semiconductor device according to the comparative embodiment.
Figure 3:
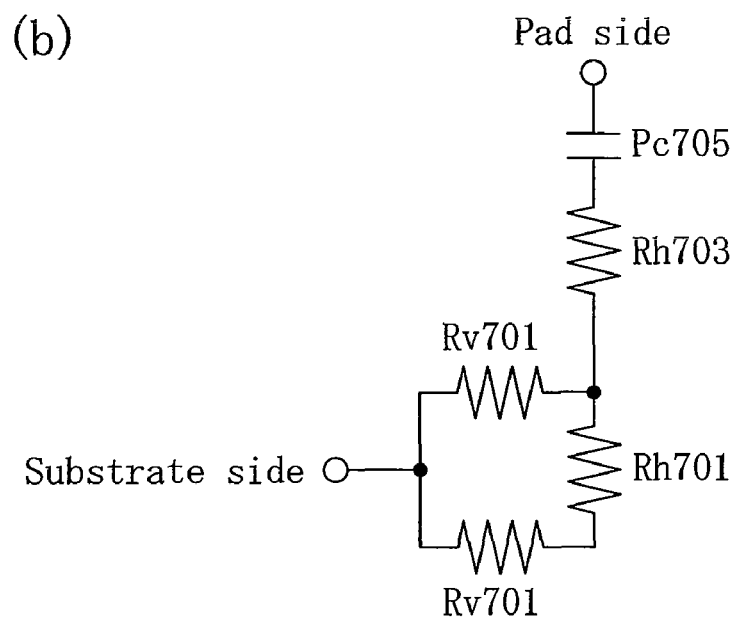

Note that the configuration of the semiconductor device of the comparative embodiment is as follows. As shown in FIG. 3(a), a semiconductor device 700 of the comparative embodiment includes a p-type semiconductor substrate 701 made of silicon, a p-type impurity diffusion region 703 formed in the semiconductor substrate 701, and an electrode pad 706 formed on the semiconductor substrate 701 with an interlayer insulating film 705 interposed therebetween and placed above the impurity diffusion region 703. As shown in FIG. 3(b), the equivalent circuit of the structure of the semiconductor device 700 includes, in this order from the substrate side toward the pad side, lateral resistors Rv701 of the semiconductor substrate 701, a vertical resistor Rh701 of the semiconductor substrate 701 connected between the resistors Rv701, a vertical resistor Rh703 of the impurity diffusion region 703, and a parasitic capacitance Pc705 of the interlayer insulating film 705.

In the equivalent circuit of the structure of the semiconductor device 700 of the comparative embodiment, where the capacitance of the parasitic capacitance Pc705 is denoted as C705, the combined capacitance Cy between the semiconductor substrate 701 and the electrode pad 706 is represented by Expression 3 below.

$$\frac{1}{Cy} = \frac{1}{C705} \qquad \text{[Expression 3]}$$

For example, where it is assumed that the capacitance Ca of the parasitic capacitance Pca is 562.5 fF, the capacitance Cb of the parasitic capacitance Pcb is 562.5 fF, and the capacitances C105 and C705 of the parasitic capacitances Pc105 and Pc705 are 38.7 fF, the combined capacitance Cx (Cx=34.0) of the present embodiment is smaller than the combined capacitance Cy (Cy=38.7) of the comparative embodiment.

As described above, by increasing the number of parasitic capacitances connected in series with one another that are included between the semiconductor substrate 101 and the electrode pad 106, it is possible to reduce the combined capacitance between the semiconductor substrate 101 and the electrode pad 106.

According to the present embodiment, by providing pn junction surfaces (see Sa and Sb in FIG. 1(b)) between the semiconductor substrate 101 and the electrode pad 106, thereby increasing the number of parasitic capacitances (see Pca and Pcb in FIG. 2(b)) included between the semiconductor substrate 101 and the electrode pad 106, it is possible to reduce the combined capacitance between the semiconductor substrate 101 and the electrode pad 106 and to suppress the propagation of noise to the electrode pad 106 via the semiconductor substrate 101.

In addition, by electrically connecting the third impurity diffusion region 102x to the ground terminal as shown in FIG. 1(b) (in other words, connecting the resistor Rh102x to the ground terminal as shown in FIG. 2(b)), noise propagating to the third impurity diffusion region 102x via the semiconductor substrate 101 can be shunted to the ground terminal, and by forming the first impurity diffusion region 102 under the third impurity diffusion region 102x so that it is in contact with the third impurity diffusion region 102x as shown in FIG. 1(b) (in other words, connecting the resistor Rv102 between the resistors Rh102 to the resistor Rh102x as shown in FIG. 2(b)), noise propagating to the first impurity diffusion region 102 via the semiconductor substrate 101 can be shunted to the ground terminal through the third impurity diffusion region 102x. Thus, it is possible to further suppress the propagation of noise to the electrode pad 106 via the semiconductor substrate 101.

Moreover, by setting the impurity concentration of the third impurity diffusion region 102x higher than the impurity concentration of the first impurity diffusion region 102, noise propagating to the first impurity diffusion region 102 via the semiconductor substrate 101 can be effectively shunted to the ground terminal through the third impurity diffusion region 102x, which has a lower impedance than that of the first impurity diffusion region 102. Thus, it is possible to further suppress the propagation of noise to the electrode pad 106 via the semiconductor substrate 101.

Since the wire 108 is placed in an area outside the formation area of the electrode pad 106, as shown in FIGS. 1(a) and 1(b), the electrode pad 106 and the wire 108 will not overlap with each other as viewed from a direction perpendicular to the principal plane of the semiconductor substrate 101, as shown in FIG. 1(a). Thus, it is possible to give a potential from outside to the third impurity diffusion region 102x without forming an unnecessary parasitic capacitance due to an overlap between the electrode pad 106 and the wire 108.

As described above, in the present embodiment, it is possible to effectively suppress the propagation of noise to the electrode pad 106 via the semiconductor substrate 101. Therefore, even when the semiconductor device 100 of the present embodiment includes various types of signal circuits, for example, it is possible to effectively suppress the propagation of noise from one of the various signal circuits (e.g., a digital switch circuit) to the electrode pad 106 via the semiconductor substrate 101, and it is therefore possible to prevent a deterioration of the device characteristics, thus realizing a semiconductor device with high performance and high reliability. Therefore, the electrode pad 106 of the present embodiment can suitably be used as an electrode pad for use in a mobile communication device such as a mobile telephone, i.e., as an electrode pad through which a high-frequency signal of a GHz band or higher is input (or output).

<Variation of First Embodiment>

Although the first embodiment is directed to a specific example where the p-type (the first conductivity type) is employed as the conductivity type of the semiconductor substrate 101, and the layered region 104 is provided in a region of the semiconductor substrate 101 under the electrode pad 106 to thereby provide the pn junction surfaces Sa and Sb in the region of the semiconductor substrate 101 under the electrode pad 106, wherein the layered region 104 includes the first impurity diffusion region 102 having a conductivity type different from the conductivity type of the semiconductor substrate 101, i.e., the n-type (the second conductivity type), the p-type second impurity diffusion region 103, and the n-type third impurity diffusion region 102x, the present invention is not limited to this, and the conductivity type of the semiconductor substrate may be n-type.

Figure 4:
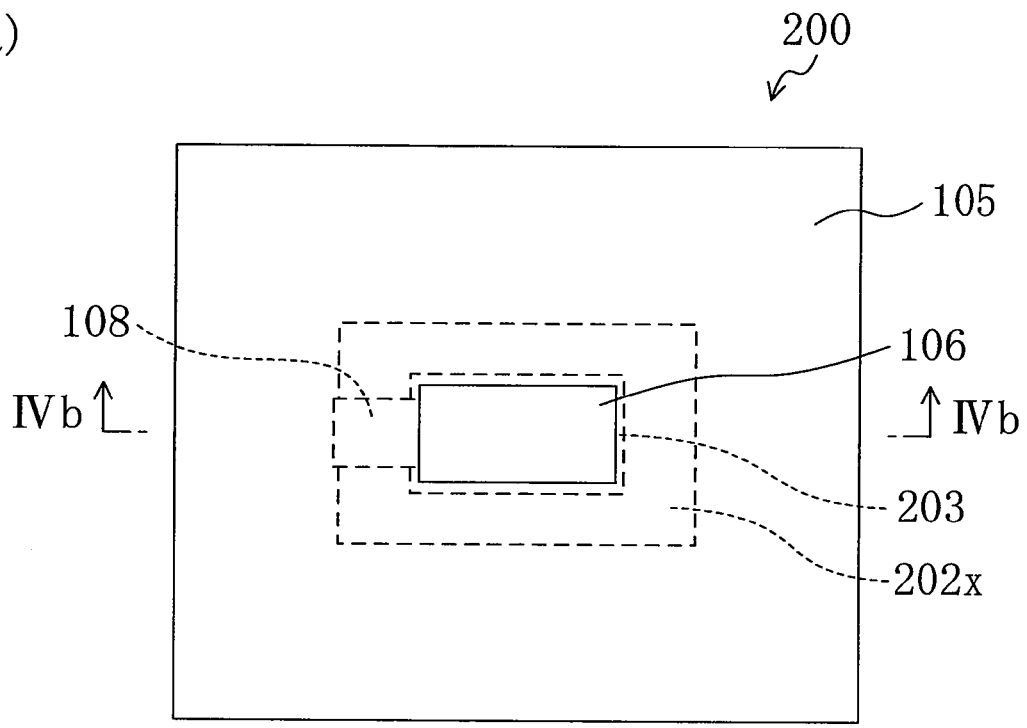
FIG. 4(a) and FIG. 4(b) show a configuration of a semiconductor device according to a variation of the first embodiment of the present invention.
Figure 4:
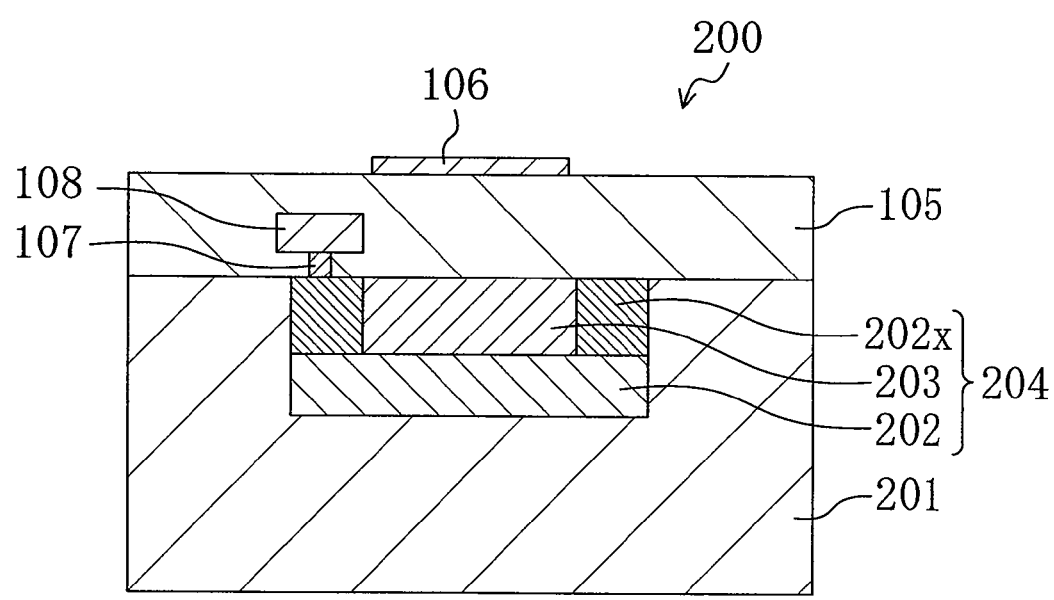

A configuration of a semiconductor device in which the conductivity type of the semiconductor substrate is n-type will now be described with reference to FIGS. 4(a) and 4(b). FIGS. 4(a) and 4(b) show the configuration of a semiconductor device according to a variation of the first embodiment of the present invention, and specifically, FIG. 4(a) is a plan view, and FIG. 4(b) is a cross-sectional view taken along line IVb-IVb shown in FIG. 4(a). Note that in FIGS. 4(a) and 4(b), like elements to those of the first embodiment will be denoted by like reference numerals to those of the first embodiment shown in FIGS. 1(a) and 1(b).

As shown in FIGS. 4(a) and 4(b), a semiconductor device 200 of this variation includes an n-type (the first conductivity type) semiconductor substrate 201, a layered region 204 formed in the semiconductor substrate 201 including a p-type (the second conductivity type) first impurity diffusion region 202, an n-type second impurity diffusion region 203 and a p-type third impurity diffusion region 202x, the electrode pad 106 formed on the semiconductor substrate 201 with the interlayer insulating film 105 interposed therebetween and placed above the layered region 204, the contact plug 107 formed in the interlayer insulating film 105 with its lower end being connected to the upper surface of the third impurity diffusion region 202x, and the wire 108 formed in the interlayer insulating film 105 with its lower surface being connected to the upper end of the contact plug 107 and electrically connected to a ground terminal (not shown).

Specifically, as shown in FIG. 4(b), the layered region 204 includes the first impurity diffusion region 202, the second impurity diffusion region 203 formed on the first impurity diffusion region 202, and the third impurity diffusion region 202x formed on the first impurity diffusion region 202 so as to cover the periphery of the second impurity diffusion region 203 while being in contact with the second impurity diffusion region 203, with the third impurity diffusion region 202x having a higher impurity concentration than that of the first impurity diffusion region 202.

As described above, the layered region 204 including the p-type first impurity diffusion region 202, the n-type second impurity diffusion region 203 and the p-type third impurity diffusion region 202x may be provided in a region of the n-type semiconductor substrate 201 under the electrode pad 106, thereby providing two pn junction surfaces in the region of the semiconductor substrate 201 under the electrode pad 106.

Second Embodiment

A semiconductor device according to a second embodiment of the present invention will now be described with reference to FIGS. 5(a) and 5(b) and FIGS. 6(a) and 6(b).

Figure 5:
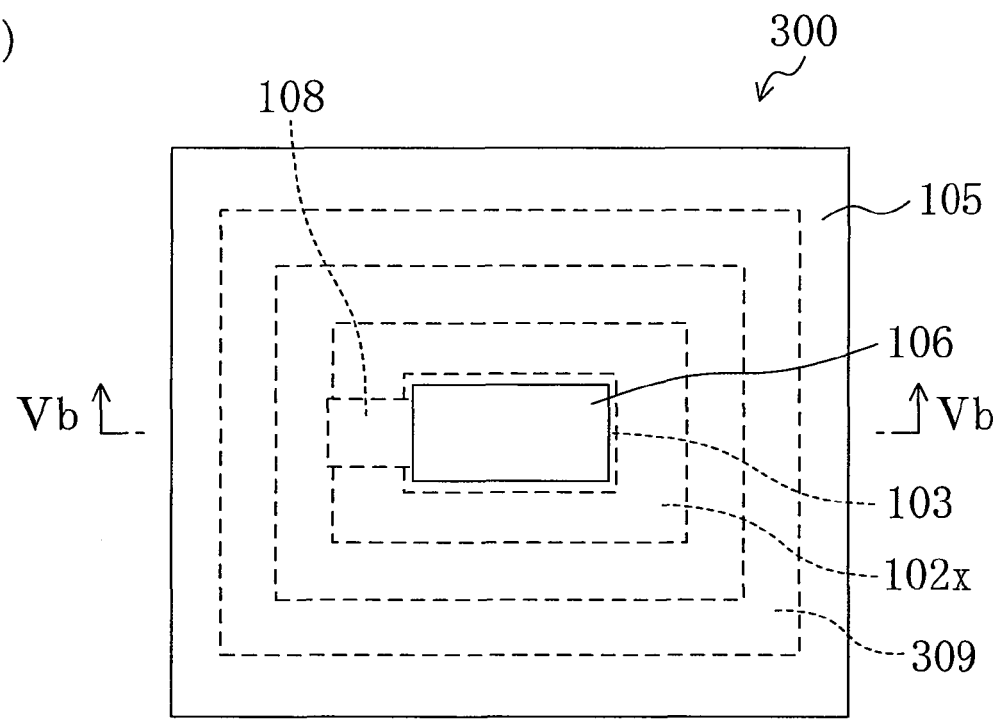
FIG. 5(a) and FIG. 5(b) show a configuration of a semiconductor device according to a second embodiment of the present invention.
Figure 5:
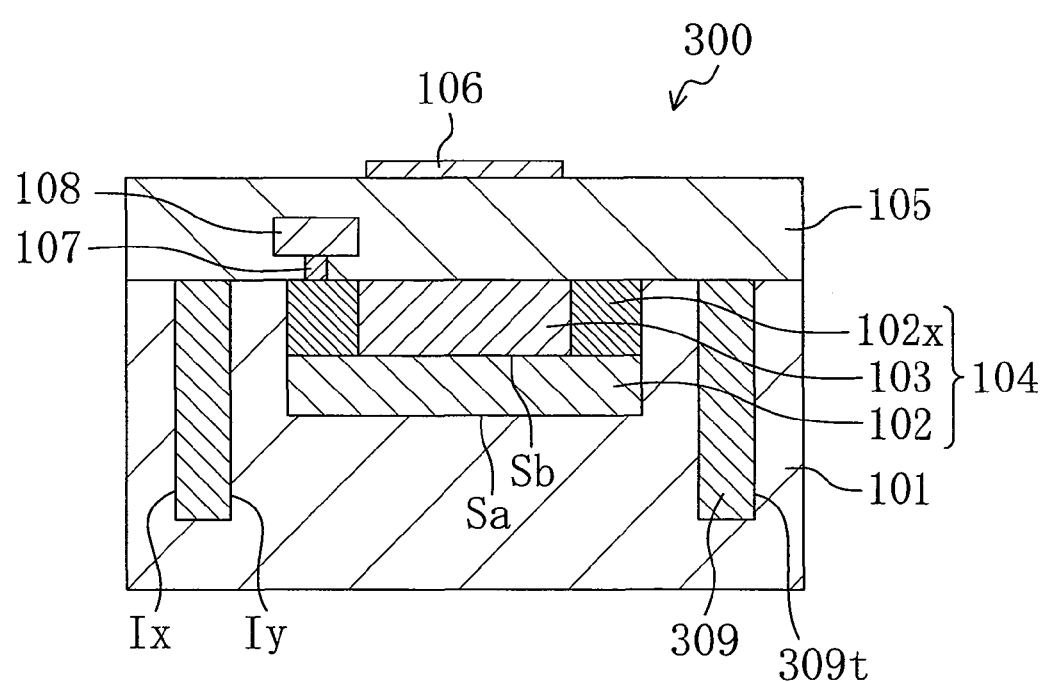

The configuration of the semiconductor device according to the second embodiment of the present invention will now be described with reference to FIGS. 5(a) and 5(b). FIGS. 5(a) and 5(b) show the configuration of the semiconductor device according to the second embodiment of the present invention, and specifically, FIG. 5(a) is a plan view, and FIG. 5(b) is a cross-sectional view taken along line Vb-Vb shown in FIG. 5(a). Note that in FIGS. 5(a) and 5(b), like elements to those of the first embodiment will be denoted by like reference numerals to those of the first embodiment shown in FIGS. 1(a) and 1(b) and will not be described redundantly.

As shown in FIGS. 5(a) and 5(b), a semiconductor device 300 of the present embodiment includes the semiconductor substrate 101, the layered region 104 including the first impurity diffusion region 102, the second impurity diffusion region 103 and the third impurity diffusion region 102x, the electrode pad 106, the wire 108 electrically connected to a ground terminal (not shown), and the contact plug 107 connecting the third impurity diffusion region 102x to the wire 108, as in the first embodiment. As a new element, it includes a ring-shaped insulating film 309 (an insulating film filling a trench 309t) formed in the semiconductor substrate 101 and surrounding the periphery of the layered region 104 while being spaced apart from the layered region 104.

Here, the insulating film 309 is formed by a trench isolation method, for example, by forming the trench 309t in the semiconductor substrate 101, and filling the trench 309t with an insulator made of a silicon oxide film, for example.

As described above, by the insulating film 309 surrounding the periphery of the layered region 104, the layered region 104 and the semiconductor substrate 101 are electrically separated from each other.

With the provision of the insulating film 309 in the semiconductor substrate 101, a parasitic capacitance is provided at an interface Ix between the semiconductor substrate 101 and the outer periphery surface of the insulating film 309, and a parasitic capacitance is provided at an interface Iy between the semiconductor substrate 101 and the inner periphery surface of the insulating film 309, wherein the two parasitic capacitances (in other words, stray capacitances) are placed in series with each other between the semiconductor substrate 101 and the electrode pad 106.

Figure 6:
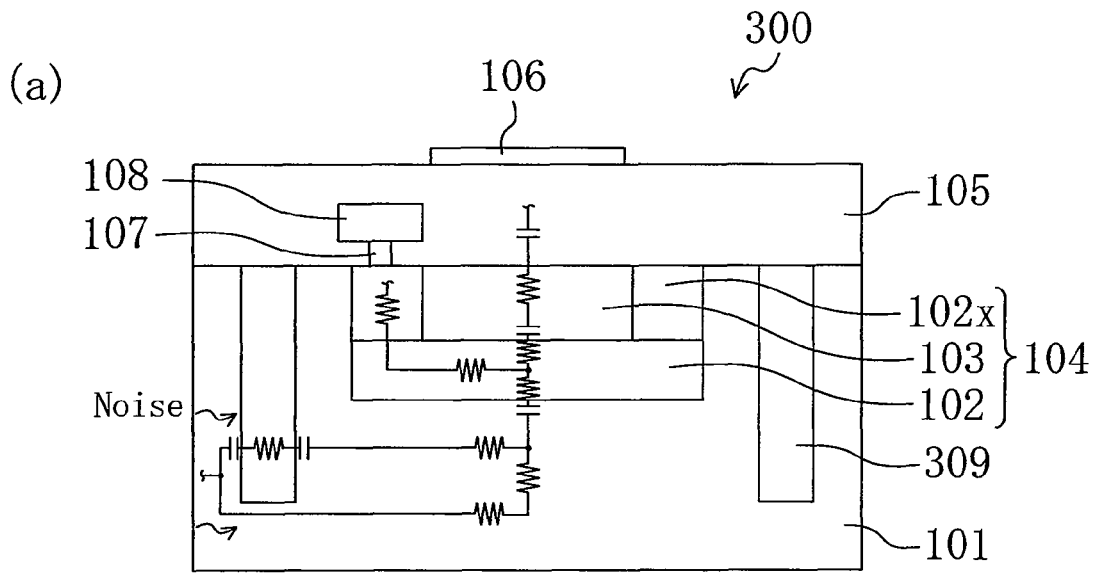
FIG. 6(a) shows parasitic capacitances, resistors, etc., formed in the semiconductor device according to the second embodiment of the present invention.
FIG. 6(b) shows an equivalent circuit of the structure of the semiconductor device according to the second embodiment of the present invention.
Figure 6:
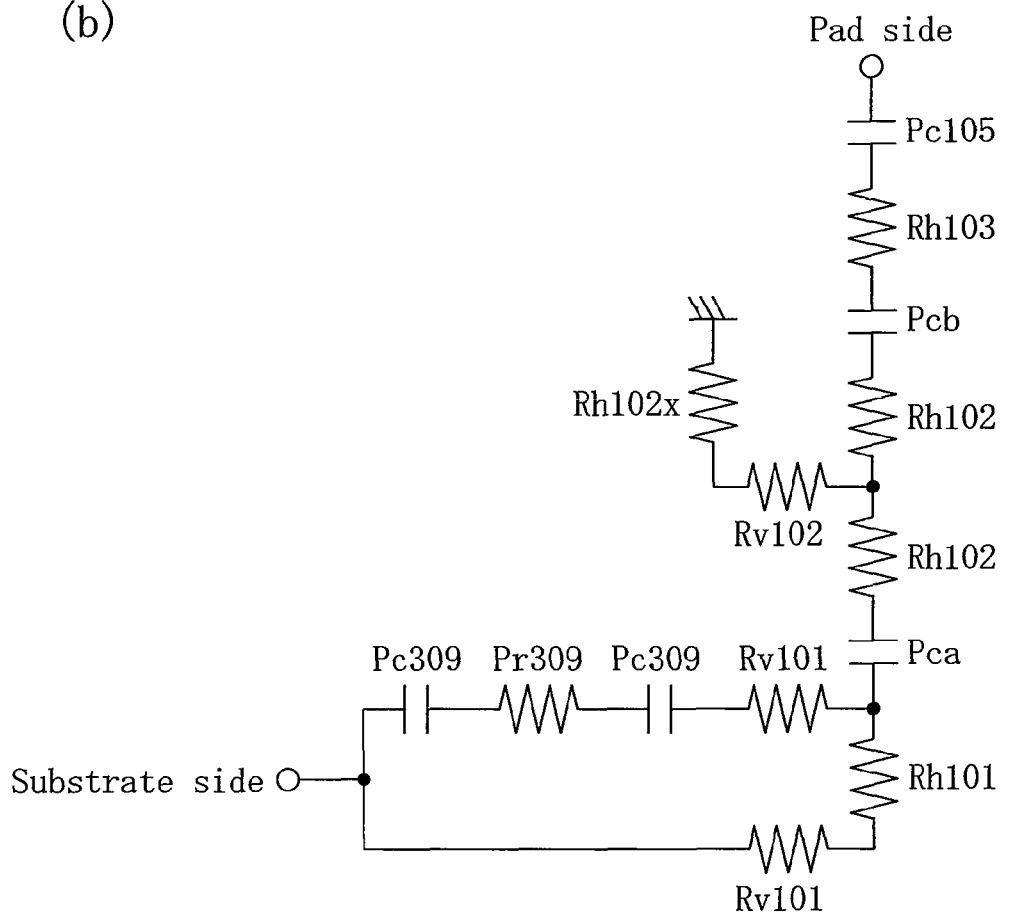

An equivalent circuit of the structure of the semiconductor device 300 according to the second embodiment of the present invention will now be described with reference to FIGS. 6(a) and 6(b). FIG. 6(a) shows parasitic capacitances, parasitic resistors and resistors formed in the semiconductor device according to the second embodiment of the present invention, and FIG. 6(b) shows an equivalent circuit of the structure of the semiconductor device according to the second embodiment of the present invention.

As shown in FIG. 6(b), the equivalent circuit of the structure of the semiconductor device 300 of the present embodiment newly includes, in this order from the substrate side toward the pad side, a parasitic capacitance Pc309 formed at the interface Ix between the semiconductor substrate 101 and the insulating film 309, a lateral parasitic resistor Pr309 of the insulating film 309, and a parasitic capacitance Pc309 formed at the interface Iy between the semiconductor substrate 101 and the insulating film 309. As in the first embodiment, it includes the resistors Rv101, the resistor Rh101, the parasitic capacitance Pca, the resistors Rh102, the parasitic capacitance Pcb, the resistor Rh103, the parasitic capacitance Pc105, the resistor Rv102 and the resistor Rh102x.

As described above, the equivalent circuit of the structure of the semiconductor device 300 of the present embodiment includes, three parasitic capacitances Pca, Pcb and Pc105 connected in series with one another between the semiconductor substrate 101 and the electrode pad 106, as in the first embodiment. In addition, it further includes two parasitic capacitances Pc309 connected in series with each other between the semiconductor substrate 101 and the electrode pad 106.

According to the present embodiment, as in the first embodiment, it is possible to provide the pn junction surface Sa (in other words, the parasitic capacitance Pca) between the semiconductor substrate 101 and the first impurity diffusion region 102 and provide the pn junction surface Sb (in other words, the parasitic capacitance Pcb) between the first impurity diffusion region 102 and the second impurity diffusion region 103. In addition, it is possible to provide the parasitic capacitance Pc309 at the interface Ix between the semiconductor substrate 101 and the outer periphery surface of the insulating film 309 and provide the parasitic capacitance Pc309 at the interface Iy between the semiconductor substrate 101 and the inner periphery surface of the insulating film 309. Therefore, since the number of parasitic capacitances connected in series with one another included between the semiconductor substrate 101 and the electrode pad 106 can be increased from that of the first embodiment, the combined capacitance between the semiconductor substrate 101 and the electrode pad 106 can be decreased from that of the first embodiment, and it is possible to further suppress the propagation of noise to the electrode pad 106 via the semiconductor substrate 101, as compared with the first embodiment.

In addition, as in the first embodiment, by electrically connecting the third impurity diffusion region 102x to the ground terminal as shown in FIG. 5(b), noise propagating to the third impurity diffusion region 102x via the semiconductor substrate 101 can be shunted to the ground terminal, and by forming the first impurity diffusion region 102 under the third impurity diffusion region 102x so that it is in contact with the third impurity diffusion region 102x as shown in FIG. 5(b), noise propagating to the first impurity diffusion region 102 via the semiconductor substrate 101 can be shunted to the ground terminal through the third impurity diffusion region 102x. Thus, it is possible to further suppress the propagation of noise to the electrode pad 106 via the semiconductor substrate 101.

Moreover, as in the first embodiment, by setting the impurity concentration of the third impurity diffusion region 102x higher than the impurity concentration of the first impurity diffusion region 102, noise propagating to the first impurity diffusion region 102 via the semiconductor substrate 101 can be effectively shunted to the ground terminal through the third impurity diffusion region 102x, which has a lower impedance than that of the first impurity diffusion region 102. Thus, it is possible to further suppress the propagation of noise to the electrode pad 106 via the semiconductor substrate 101.

Since the wire 108 is placed in an area outside the formation area of the electrode pad 106, as shown in FIGS. 5(a) and 5(b), as in the first embodiment, the electrode pad 106 and the wire 108 will not overlap with each other as viewed from a direction perpendicular to the principal plane of the semiconductor substrate 101, as shown in FIG. 5(a). Thus, it is possible to give a potential from outside to the third impurity diffusion region 102x without forming an unnecessary parasitic capacitance due to an overlap between the electrode pad 106 and the wire 108.

Third Embodiment

A semiconductor device according to the third embodiment of the present invention will now be described with reference to FIGS. 7(a) and 7(b) and FIGS. 8(a) and 8(b).

The configuration of the semiconductor device according to the third embodiment of the present invention will now be described with reference to FIGS. 7(a) and 7(b). FIGS. 7(a) and 7(b) show the configuration of the semiconductor device according to the third embodiment of the present invention, and specifically, FIG. 7(a) is a plan view, and FIG. 7(b) is a cross-sectional view taken along line VIIb-VIIb shown in FIG. 7(a). Note that in FIGS. 7(a) and 7(b), like elements to those of the first embodiment will be denoted by like reference numerals to those of the first embodiment shown in FIGS. 1(a) and 1(b) and will not be described redundantly.

As shown in FIGS. 7(a) and 7(b), a semiconductor device 400 of the present embodiment includes the semiconductor substrate 101, the layered region 104 including the first impurity diffusion region 102, the second impurity diffusion region 103 and the third impurity diffusion region 102x, the electrode pad 106, the wire 108 electrically connected to a ground terminal (not shown), and the contact plug 107 connecting the third impurity diffusion region 102x to the wire 108, as in the first embodiment. As new elements, it includes a ring-shaped conductive film 410 (a conductive film filling a trench 410t) formed in the semiconductor substrate 101 and surrounding the periphery of the layered region 104 while being spaced apart from the layered region 104, a contact plug 411 formed in the interlayer insulating film 105 with its lower end being connected to the upper surface of the conductive film 410, and a wire 412 formed in the interlayer insulating film 105 with its lower surface being connected to the upper end of the contact plug 411 and electrically connected to a conductive film ground terminal (not shown).

Here, the conductive film 410 is formed by a trench isolation method, for example, by forming the trench 410t in the semiconductor substrate 101, and filling the trench 410t with a conductor made of a metal such as aluminum or copper, for example.

As described above, as the conductive film 410 surrounding the periphery of the layered region 104 is connected, via the contact plug 411, to the wire 412, which is electrically connected to the conductive film ground terminal, the conductive film 410 is electrically connected to the conductive film ground terminal.

By the conductive film 410 surrounding the periphery of the layered region 104, the layered region 104 and the semiconductor substrate 101 are separated from each other.

Figure 8:
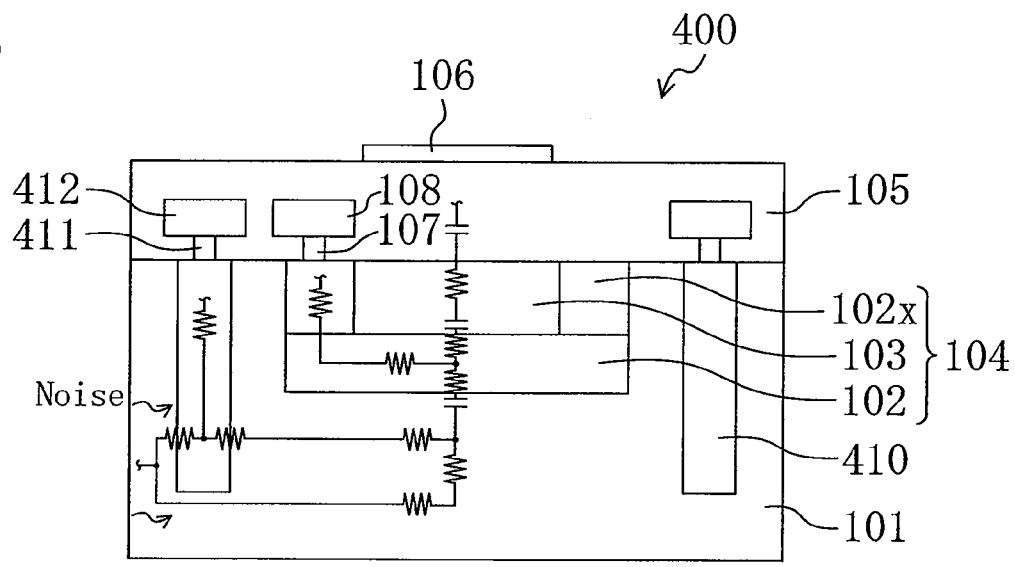
FIG. 8(a) shows parasitic capacitances, resistors, etc., formed in the semiconductor device according to the third embodiment of the present invention.
FIG. 8(b) shows an equivalent circuit of the structure of the semiconductor device according to the third embodiment of the present invention.
Figure 8:
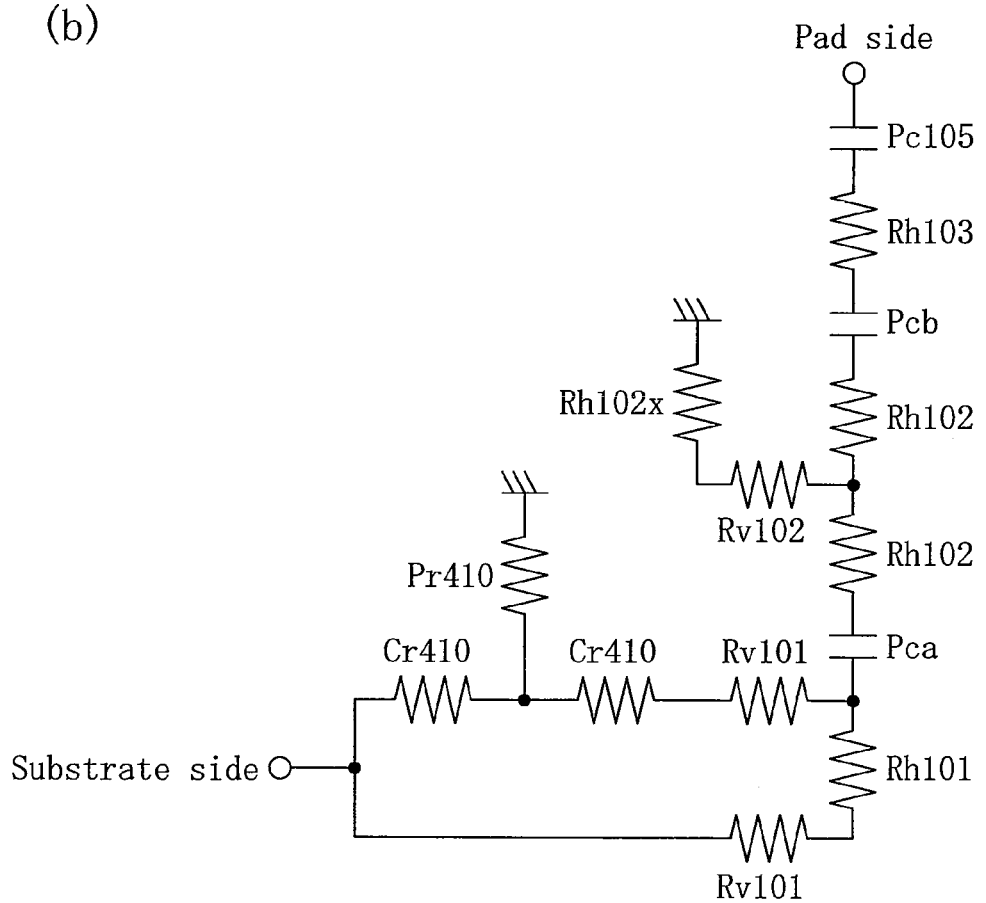

An equivalent circuit of the structure of the semiconductor device 400 according to the third embodiment of the present invention will now be described with reference to FIGS. 8(a) and 8(b). FIG. 8(a) shows parasitic capacitances, contact resistors, parasitic resistors and resistors formed in the semiconductor device according to the third embodiment of the present invention, and FIG. 8(b) shows an equivalent circuit of the structure of the semiconductor device according to the third embodiment of the present invention.

As shown in FIG. 8(b), the equivalent circuit of the structure of the semiconductor device 400 of the present embodiment newly includes, in this order from the substrate side toward the pad side, an ohmic contact resistor Cr410 formed at an interface Iv between the semiconductor substrate 101 and the outer periphery surface of the conductive film 410, an ohmic contact resistor Cr410 formed at an interface Iw between the semiconductor substrate 101 and the inner periphery surface of the conductive film 410, a vertical parasitic resistor Pr410 of the conductive film 410 connected between the contact resistors Cr410, and a conductive film ground terminal connected to the parasitic resistor Pr410. As in the first embodiment, it includes the resistors Rv101, the resistor Rh101, the parasitic capacitance Pca, the resistors Rh102, the parasitic capacitance Pcb, the resistor Rh103, the parasitic capacitance Pc105, the resistor Rv102 and the resistor Rh102x.

As described above, the equivalent circuit of the structure of the semiconductor device 400 of the present embodiment includes, three parasitic capacitances Pca, Pcb and Pc105 connected in series with one another between the semiconductor substrate 101 and the electrode pad 106, as in the first embodiment.

According to the present embodiment, as in the first embodiment, by providing pn junction surfaces (see Sa and Sb in FIG. 7(b)) between the semiconductor substrate 101 and the electrode pad 106, thereby increasing the number of parasitic capacitances (see Pca and Pcb in FIG. 8(b)) included between the semiconductor substrate 101 and the electrode pad 106, it is possible to reduce the combined capacitance between the semiconductor substrate 101 and the electrode pad 106 and to suppress the propagation of noise to the electrode pad 106 via the semiconductor substrate 101.

In addition, as in the first embodiment, by electrically connecting the third impurity diffusion region 102x to the ground terminal as shown in FIG. 7(b), noise propagating to the third impurity diffusion region 102x via the semiconductor substrate 101 can be shunted to the ground terminal, and by forming the first impurity diffusion region 102 under the third impurity diffusion region 102x so that it is in contact with the third impurity diffusion region 102x as shown in FIG. 7(b), noise propagating to the first impurity diffusion region 102 via the semiconductor substrate 101 can be shunted to the ground terminal through the third impurity diffusion region 102x. Thus, it is possible to further suppress the propagation of noise to the electrode pad 106 via the semiconductor substrate 101.

Moreover, as in the first embodiment, by setting the impurity concentration of the third impurity diffusion region 102x higher than the impurity concentration of the first impurity diffusion region 102, noise propagating to the first impurity diffusion region 102 via the semiconductor substrate 101 can be effectively shunted to the ground terminal through the third impurity diffusion region 102x, which has a lower impedance than that of the first impurity diffusion region 102. Thus, it is possible to further suppress the propagation of noise to the electrode pad 106 via the semiconductor substrate 101.

Moreover, as shown in FIG. 7(b), by electrically connecting the conductive film 410, surrounding the periphery of the layered region 104, to the conductive film ground terminal (in other words, connecting the parasitic resistor Pr410 between the contact resistors Cr410 to the conductive film ground terminal as shown in FIG. 8(b)), noise propagating to the conductive film 410 via the semiconductor substrate 101 can be shunted to the conductive film ground terminal. Thus, it is possible to further suppress the propagation of noise to the electrode pad 106 via the semiconductor substrate 101.

Since the wire 108 is placed in an area outside the formation area of the electrode pad 106, as shown in FIGS. 7(a) and 7(b), as in the first embodiment, the electrode pad 106 and the wire 108 will not overlap with each other as viewed from a direction perpendicular to the principal plane of the semiconductor substrate 101, as shown in FIG. 7(a). Thus, it is possible to give a potential from outside to the third impurity diffusion region 102x without forming an unnecessary parasitic capacitance due to an overlap between the electrode pad 106 and the wire 108.

Note that although the third embodiment is directed to a specific example where the third impurity diffusion region 102x is electrically connected to the ground terminal, and the conductive film 410 is electrically connected to the conductive film ground terminal, so that the potential of the third impurity diffusion region 102x and the potential of the conductive film 410 are equal to each other, the present invention is not limited to this, and similar effects to those of the present embodiment can be obtained even when these potentials are different from each other. Note however that the potential of the third impurity diffusion region and the potential of the conductive film each need to be fixed to a constant potential also in this case.

<Simulation Results>

In order to more effectively describe the effects of the semiconductor devices 100, 300 and 400 of the first, second and third embodiments, a simulation was conducted with the semiconductor devices 100, 300 and 400 and with the semiconductor device 700 of the comparative embodiment. The simulation results of the semiconductor devices 100, 300 and 400 will be compared with the simulation results of the semiconductor device 700.

First, the configuration of each of the elements (specifically, the semiconductor substrate, the layered region, the electrode pad, and the interlayer insulating film) of the semiconductor devices 100, 300 and 400 and the semiconductor device 700 used in the simulation will be described below.

—Semiconductor Substrate—

The resistivity of the semiconductor substrate 101 in the semiconductor devices 100, 300 and 400 is equal to the resistivity of the semiconductor substrate 701 in the semiconductor device 700.

—Layered Region—

The resistivity of the second impurity diffusion region 103 in the semiconductor devices 100, 300 and 400 is equal to the resistivity of the impurity diffusion region 703 in the semiconductor device 700. The distance from the upper surface of the semiconductor substrate 101 to the lower surface of the second impurity diffusion region 103 is equal to the distance from the upper surface of the semiconductor substrate 701 to the lower surface of the impurity diffusion region 703. The resistivity of the third impurity diffusion region 102$x$ in the semiconductor devices 100, 300 and 400 is lower than the resistivity of the first impurity diffusion region 102. Here, the "resistivity" as used in this specification refers to the impedance per unit length.

—Electrode Pad—

The electrode pad 106 in the semiconductor devices 100, 300 and 400 and the electrode pad 706 in the semiconductor device 700 have the same size, and are made of the same material as the electrode pad 106 (specifically, aluminum, for example).

—Interlayer Insulating Film—

The interlayer insulating film 105 in the semiconductor devices 100, 300 and 400 and the interlayer insulating film 705 in the semiconductor device 700 have the same thickness and are made of the same material.

With the semiconductor devices 100, 300 and 400 of the first, second and third embodiments including the elements as specified above, values of parasitic capacitance, resistance, etc., included in the equivalent circuit of the structure of the semiconductor devices 100, 300 and 400 are as follows.

Parasitic capacitance Pc105 of interlayer insulating film 105=38.7 fF

Vertical resistance Rh103 of second impurity diffusion region 103=0.18Ω

Parasitic capacitance Pcb formed at pn junction surface Sb=562.5 fF

Vertical resistance Rh102 of first impurity diffusion region 102=0.1Ω

Lateral resistance Rv102 of first impurity diffusion region 102=9.6Ω

Vertical resistance Rh102$x$ of third impurity diffusion region 102$x$=0.37Ω

Parasitic capacitance Pca formed at pn junction surface Sa=562.5 fF

Vertical resistance Rh101 of semiconductor substrate 101=142Ω

Lateral resistance Rv101 of semiconductor substrate 101=826Ω

Parasitic capacitance Pc309 formed at interfaces Ix and Iy=298 fF

Lateral parasitic resistance Pr309 of insulating film 309=0.5Ω

Contact resistance Cr410 formed at interfaces Iv and Iw=0.1Ω

Vertical parasitic resistance Pr410 of conductive film 410=0.1Ω

With the semiconductor device 700 of the comparative embodiment including the elements as specified above, values of parasitic capacitance, resistance, etc., included in the equivalent circuit of the structure of the semiconductor device 700 are as follows.

Parasitic capacitance Pc705 of interlayer insulating film 705=38.7 fF (=Pc105)

Vertical resistance Rh703 of impurity diffusion region 703=0.18Ω (=Rh103)

Vertical resistance Rh701 of semiconductor substrate 701=142Ω (=Rh101)

Lateral resistance Rv701 of semiconductor substrate 701=826Ω (=Rv101)

Figure 9:
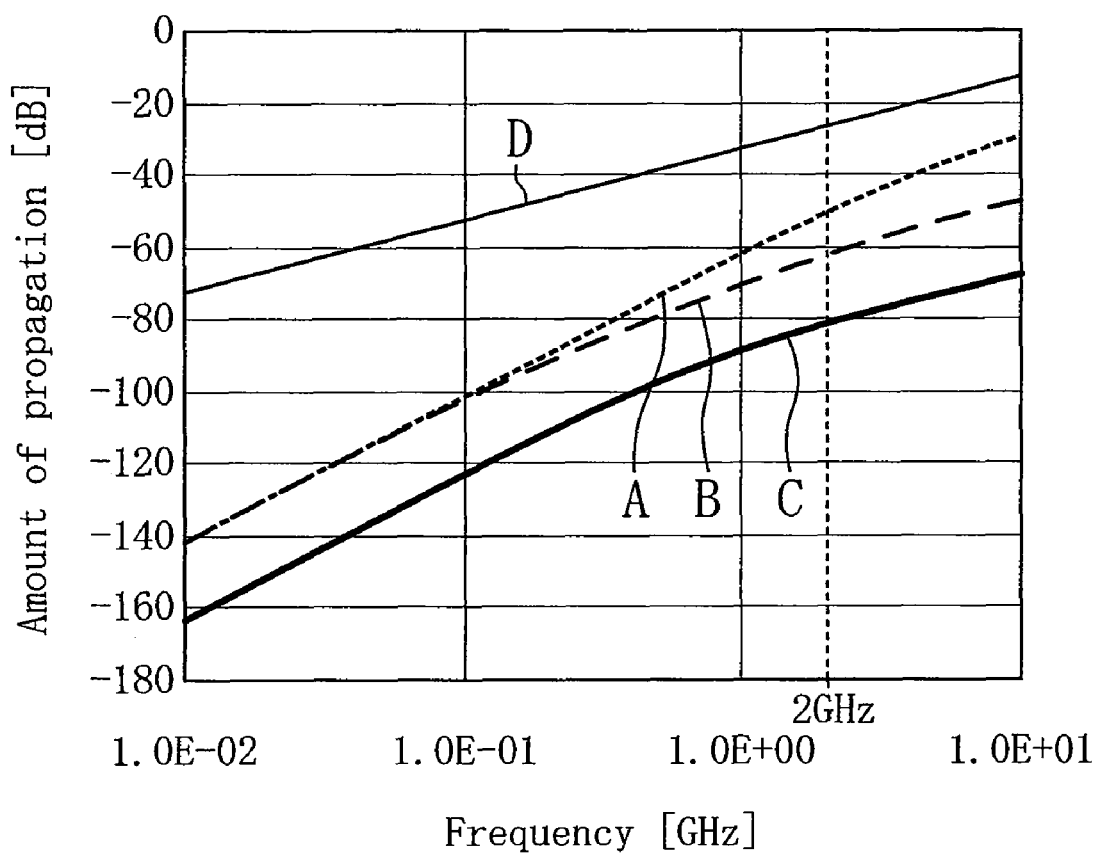
FIG. 9 is a graph showing frequency characteristics of the amount of propagation of a signal propagating to an electrode pad via a semiconductor substrate.

A simulation was conducted with the semiconductor devices 100, 300, 400 and 700 including the elements as specified above to examine the frequency characteristics of the amount of propagation of a signal propagating to the electrode pad via the semiconductor substrate. The simulation results will be described with reference to FIG. 9 and Table 1. FIG. 9 is a graph showing frequency characteristics of the amount of propagation of a signal propagating to the electrode pad via the semiconductor substrate.

The horizontal axis shown in FIG. 9 represents the frequency of the signal propagating to the electrode pad via the semiconductor substrate, and the vertical axis represents the amount of signal propagation. A curve A in FIG. 9 is for the semiconductor device 100, a curve B is for the semiconductor device 300, a curve C is for the semiconductor device 400, and a curve D is for the semiconductor device 700. Note that "1.0E-02" appearing along the horizontal axis means $1.0 \times 10^{-2}$.

As shown in FIG. 9, the amount of propagation of the semiconductor devices 100, 300 and 400 of the first, second and third embodiments is smaller than the amount of propagation of the semiconductor device 700 of the comparative embodiment across the entire range of frequency shown along the horizontal axis. The semiconductor device 400 has the smallest amount of propagation, followed by the semiconductor device 300, and then by the semiconductor device 100. This shows that the semiconductor device 400 has the highest effect in suppressing the noise propagation, followed by the semiconductor device 300, and then by the semiconductor device 100.

An evaluation as follows was conducted in order to examine the attenuation characteristics of the semiconductor devices 100, 300 and 400 of the first, second and third embodiments. For example, with a signal having a frequency of 2 GHz, the amount of propagation of each of the semiconductor devices 100, 300 and 400 was subtracted from the amount of propagation of the semiconductor device 700 to calculate the difference therebetween. The differences are as shown in Table 1 below.

TABLE 1

|  | First Embodiment | Second Embodiment | Third Embodiment |
|---|---|---|---|
| Difference [dB] | 24.5 | 36.2 | 55.5 |

As shown in Table 1, the semiconductor device 400 of the third embodiment has the largest difference, followed by the semiconductor device 300 of the second embodiment, and then by the semiconductor device 100 of the first embodiment. This shows that the semiconductor device 400 has the highest attenuation characteristics at 2 GHz, for example, followed by the semiconductor device 300, and then by the semiconductor device 100.

Note that although the first to third embodiments are directed to specific examples where the third impurity diffusion region 102$x$, which is formed on the first impurity diffusion region 102 so that it is in contact with the first impurity diffusion region 102, is connected, via the contact plug 107, to the wire 108, which is electrically connected to the ground terminal, thus electrically connecting the first impurity diffusion region 102 to the ground terminal, the present invention is not limited to this. For example, the first impurity diffusion region may be electrically connected to the ground terminal without providing the third impurity diffusion region.

Although the first to third embodiments are directed to specific examples where the potential of the third impurity diffusion region 102$x$ is fixed to the ground potential, the present invention is not limited to this, and the potential of the third impurity diffusion region may be fixed to a constant potential.

Fourth Embodiment

A semiconductor device according to a fourth embodiment of the present invention will now be described with reference to FIGS. 10($a$) and 10($b$).

The configuration of the semiconductor device according to the fourth embodiment of the present invention will now be described with reference to FIGS. 10($a$) and 10($b$). FIGS. 10($a$) and 10($b$) show the configuration of the semiconductor device according to the fourth embodiment of the present invention, and specifically, FIG. 10($a$) is a plan view, and FIG. 10($b$) is a cross-sectional view taken along line Xb-Xb shown in FIG. 10($a$). Note that in FIGS. 10($a$) and 10($b$), like elements to those of the third embodiment will be denoted by like reference numerals to those of the third embodiment shown in FIGS. 7($a$) and 7($b$) and will not be described redundantly.

Figure 10:
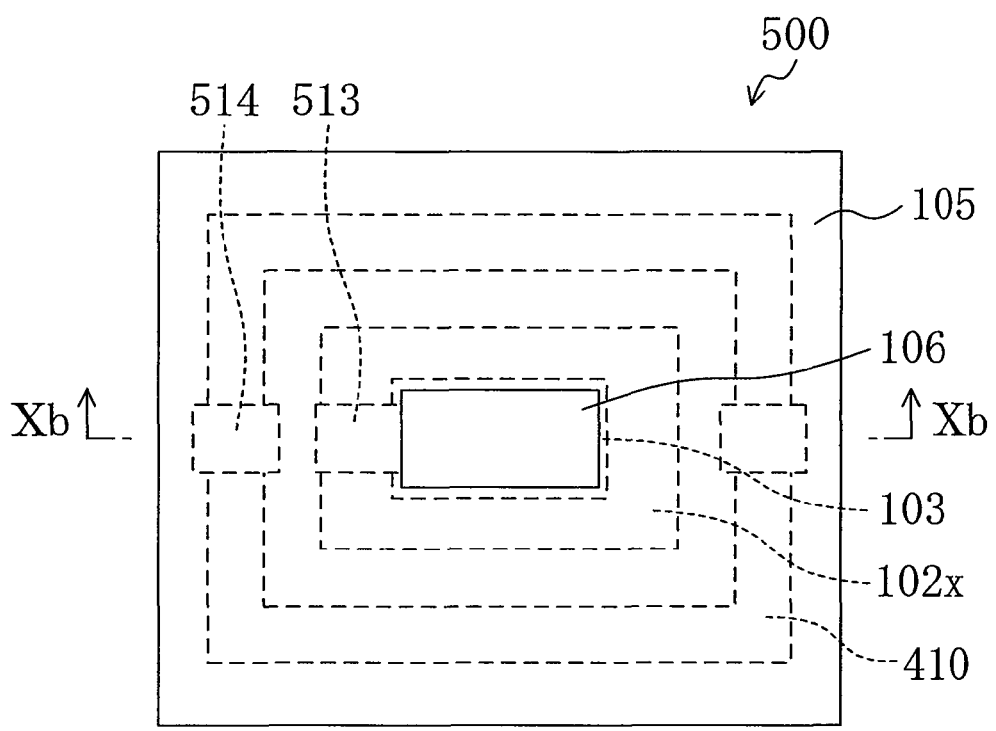
FIG. 10(a) and FIG. 10(b) show a configuration of a semiconductor device according to a fourth embodiment of the present invention.
Figure 10:
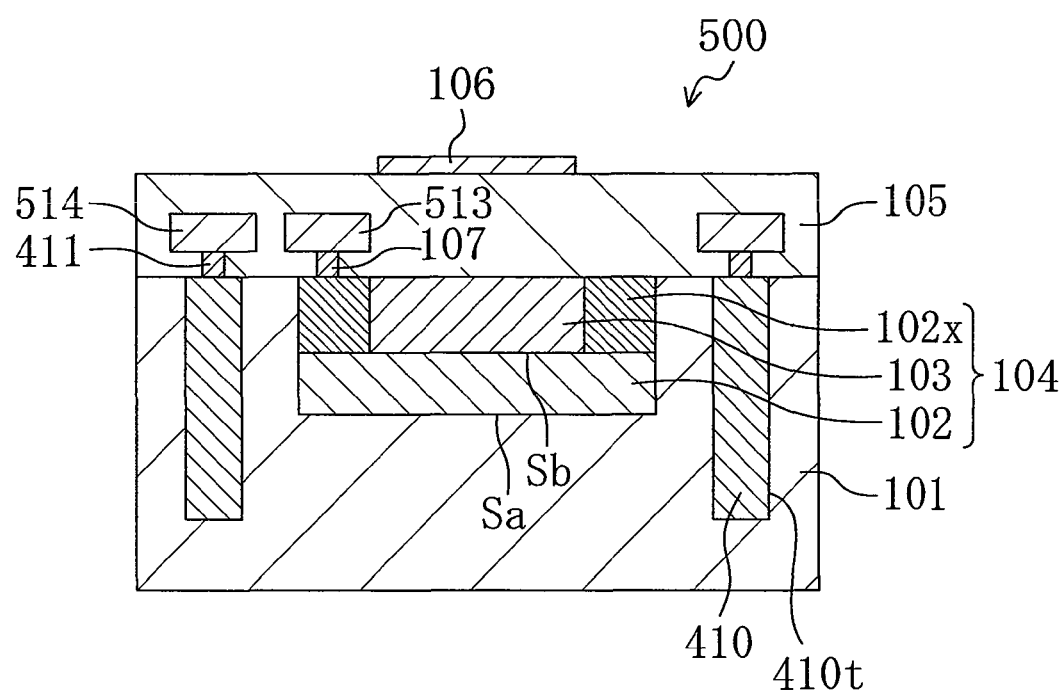

As shown in FIGS. 10($a$) and 10($b$), a semiconductor device 500 of the present embodiment includes the layered region 104 formed in the semiconductor substrate 101 and including the first impurity diffusion region 102, the second impurity diffusion region 103 and the third impurity diffusion region 102$x$, and the electrode pad 106, as in the third embodiment.

In addition, it includes the contact plug 107 formed in the interlayer insulating film 105 with its lower end being connected to the upper surface of the third impurity diffusion region 102$x$, and a wire 513 formed in the interlayer insulating film 105 with its lower surface being connected to the upper end of the contact plug 107 and electrically connected to a first terminal (not shown) fixed to a first potential. As described above, in the present embodiment, the wire 513 fixed to the first potential is provided, instead of the wire 108 of the third embodiment, which is fixed to the ground potential.

Moreover, it includes the ring-shaped conductive film 410 formed in the semiconductor substrate 101 and surrounding the periphery of the layered region 104 while being spaced apart from the layered region 104, the contact plug 411 formed in the interlayer insulating film 105 with its lower end being connected to the upper surface of the conductive film 410, and a wire 514 formed in the interlayer insulating film 105 with its lower surface being connected to the upper end of the contact plug 411 and electrically connected to a second terminal, which is fixed to a second potential (not shown; note that the second potential is different from the first potential). As described above, in the present embodiment, the wire 514 fixed to the second potential is provided, instead of the wire 412 of the third embodiment, which is fixed to the ground potential.

Moreover, it further includes detection means (not shown) for detecting a noise signal component leaking from the conductive film 410, control means (not shown) for controlling the potential of the third impurity diffusion region 102$x$ to be at the first potential based on the noise signal component detected by the detection means, and control means (not shown) for controlling the potential of the conductive film 410 to be at the second potential based on the noise signal component detected by the detection means.

Here, a difference between the present embodiment and the third embodiment will be described below.

Figure 7:
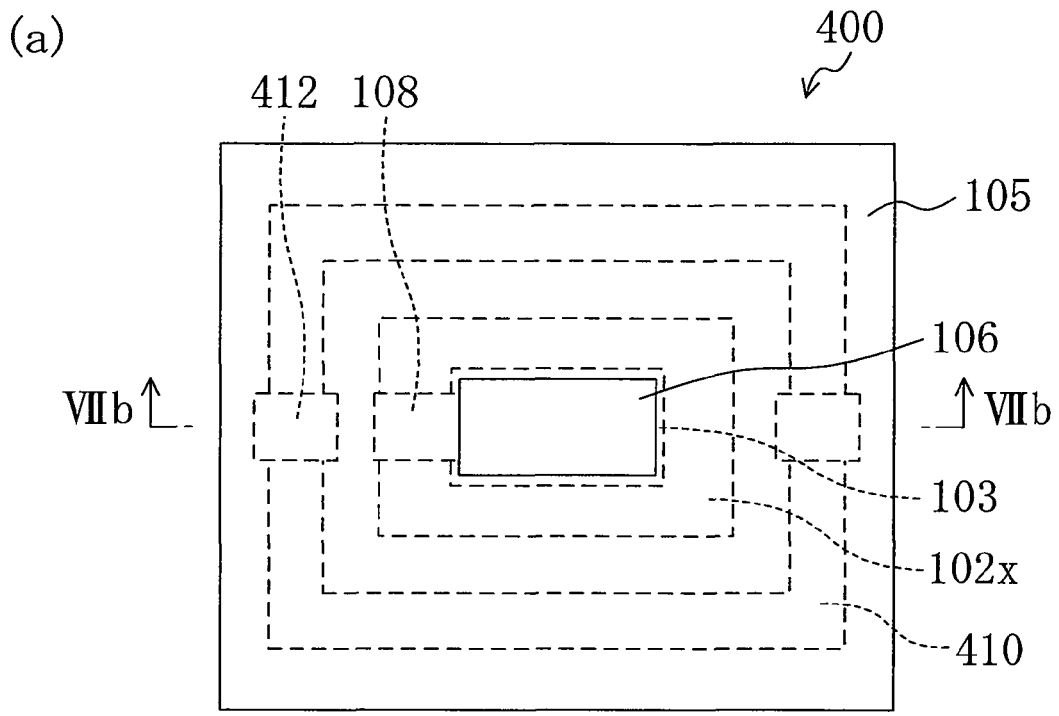
FIG. 7(a) and FIG. 7(b) show a configuration of a semiconductor device according to a third embodiment of the present invention.
Figure 7:
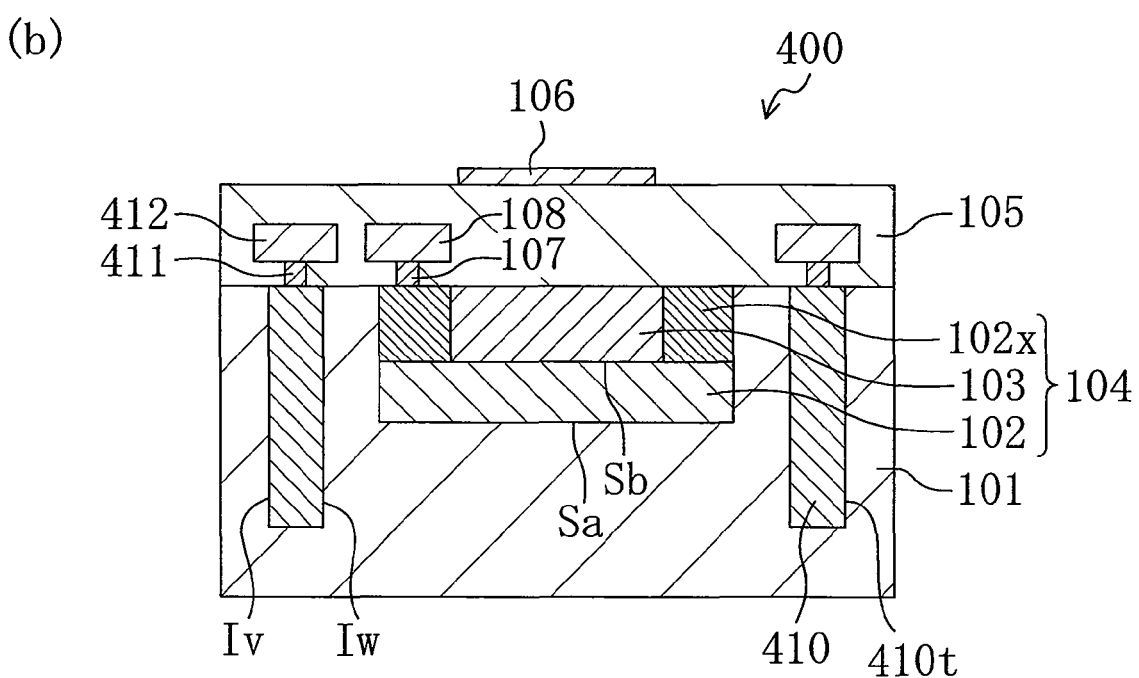

In the third embodiment, the third impurity diffusion region 102$x$ is electrically connected to the ground terminal and the conductive film 410 is electrically connected to the conductive film ground terminal, as shown in FIG. 7($b$), whereas in the present embodiment, the third impurity diffusion region 102$x$ is electrically connected to the first terminal fixed to the first potential and the conductive film 410 is electrically connected to the second terminal fixed to the second potential, as shown in FIG. 10($b$).

According to the present embodiment, as in the third embodiment, by providing pn junction surfaces (see Sa and Sb in FIG. 10($b$)) between the semiconductor substrate 101 and the electrode pad 106, thereby increasing the number of parasitic capacitances included between the semiconductor substrate 101 and the electrode pad 106, it is possible to reduce the combined capacitance between the semiconductor substrate 101 and the electrode pad 106 and to suppress the propagation of noise to the electrode pad 106 via the semiconductor substrate 101.

In addition, by electrically connecting the third impurity diffusion region 102$x$ to the first terminal as shown in FIG. 10($b$), noise propagating to the third impurity diffusion region 102$x$ via the semiconductor substrate 101 can be shunted to the first terminal, and by forming the first impurity diffusion region 102 under the third impurity diffusion region 102$x$ so that it is in contact with the third impurity diffusion region 102$x$ as shown in FIG. 10($b$), noise propagating to the first impurity diffusion region 102 via the semiconductor substrate 101 can be shunted to the first terminal through the third impurity diffusion region 102$x$. Thus, it is possible to further suppress the propagation of noise to the electrode pad 106 via the semiconductor substrate 101.

Moreover, by setting the impurity concentration of the third impurity diffusion region 102$x$ higher than the impurity concentration of the first impurity diffusion region 102, noise propagating to the first impurity diffusion region 102 via the semiconductor substrate 101 can be effectively shunted to the first terminal through the third impurity diffusion region 102$x$, which has a lower impedance than that of the first impurity diffusion region 102. Thus, it is possible to further suppress the propagation of noise to the electrode pad 106 via the semiconductor substrate 101.

Moreover, as shown in FIG. 10($b$), by electrically connecting the conductive film 410, surrounding the periphery of the layered region 104, to the second terminal, noise propagating to the conductive film 410 via the semiconductor substrate 101 can be shunted to the second terminal. Thus, it is possible to further suppress the propagation of noise to the electrode pad 106 via the semiconductor substrate 101.

Moreover, by controlling the potential of the conductive film 410 and the potential of the third impurity diffusion region 102$x$ separately from each other, an anti-noise signal having a reverse phase with respect to a noise signal leaking from the conductive film 410 can be added to the noise signal propagating to the first and third impurity diffusion regions 102 and 102$x$ from the conductive film 410 to cancel out the noise signal and the anti-noise signal by each other. Thus, as compared with the third embodiment, it is possible to further suppress the propagation of a noise signal to the electrode pad 106 via the semiconductor substrate 101.

Since the wire 513 is placed in an area outside the formation area of the electrode pad 106, as shown in FIGS. 10(a) and 10(b), the electrode pad 106 and the wire 513 will not overlap with each other as viewed from a direction perpendicular to the principal plane of the semiconductor substrate 101, as shown in FIG. 10(a). Thus, it is possible to give a potential from outside to the third impurity diffusion region 102x without forming an unnecessary parasitic capacitance due to an overlap between the electrode pad 106 and the wire 513.

Note that although the fourth embodiment is directed to a specific example where the third impurity diffusion region 102x, which is formed on the first impurity diffusion region 102 so that it is in contact with the first impurity diffusion region 102, is connected, via the contact plug 107, to the wire 513, which is electrically connected to the first terminal, thereby electrically connecting the first impurity diffusion region 102 to the first terminal, the present invention is not limited to this. For example, the first impurity diffusion region may be electrically connected to the first terminal without providing the third impurity diffusion region.

Although the second to fourth embodiments are directed to specific examples where a semiconductor substrate whose conductivity type is p-type is used, and the layered region 104 including the n-type first impurity diffusion region 102, the p-type second impurity diffusion region 103 and the n-type third impurity diffusion region 102x is provided in a region of the semiconductor substrate 101 under the electrode pad 106, for the purpose of providing two pn junction surfaces in series with each other between the semiconductor substrate and the electrode pad, the present invention is not limited to this. For example, as in the variation of the first embodiment, a semiconductor substrate whose conductivity type is n-type may be used, and a layered region including a p-type first impurity diffusion region, an n-type second impurity diffusion region and a p-type third impurity diffusion region may be provided in a region of the semiconductor substrate under the electrode pad. Also in this case, two pn junction surfaces can be provided in series with each other between the semiconductor substrate and the electrode pad.

Although the third to fourth embodiments are directed to specific examples where the entire periphery of the layered region 104 is surrounded by the conductive film 410, the present invention is not limited to this, and the periphery of the layered region may be partly surrounded by the conductive film.

Fifth Embodiment

Figure 11:
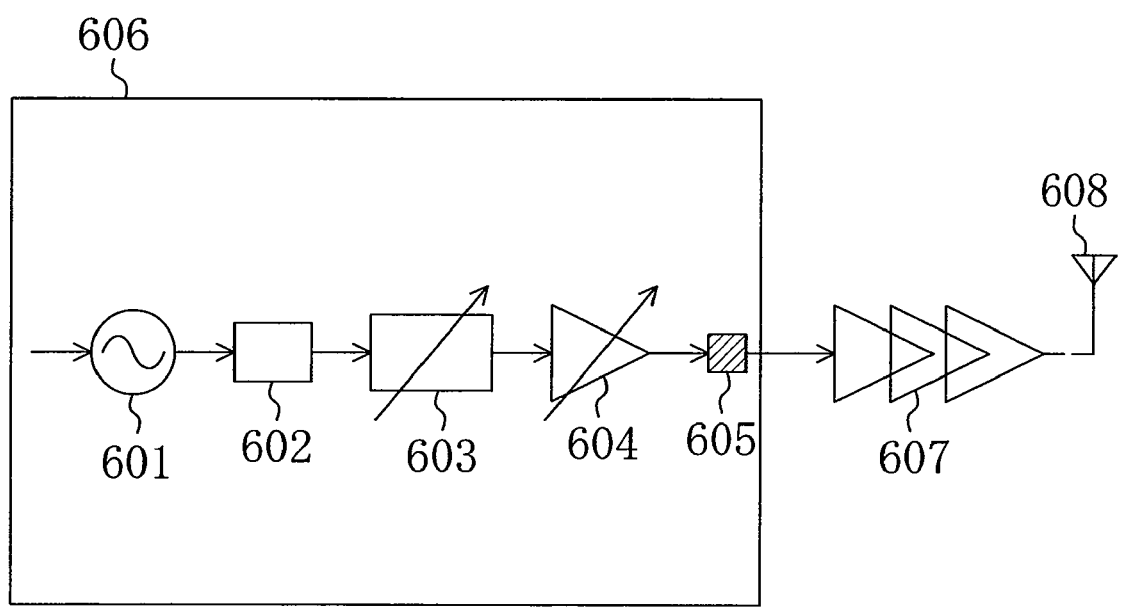
FIG. 11 is a block diagram showing a wireless circuit device according to a fifth embodiment of the present invention.
Figure 12:
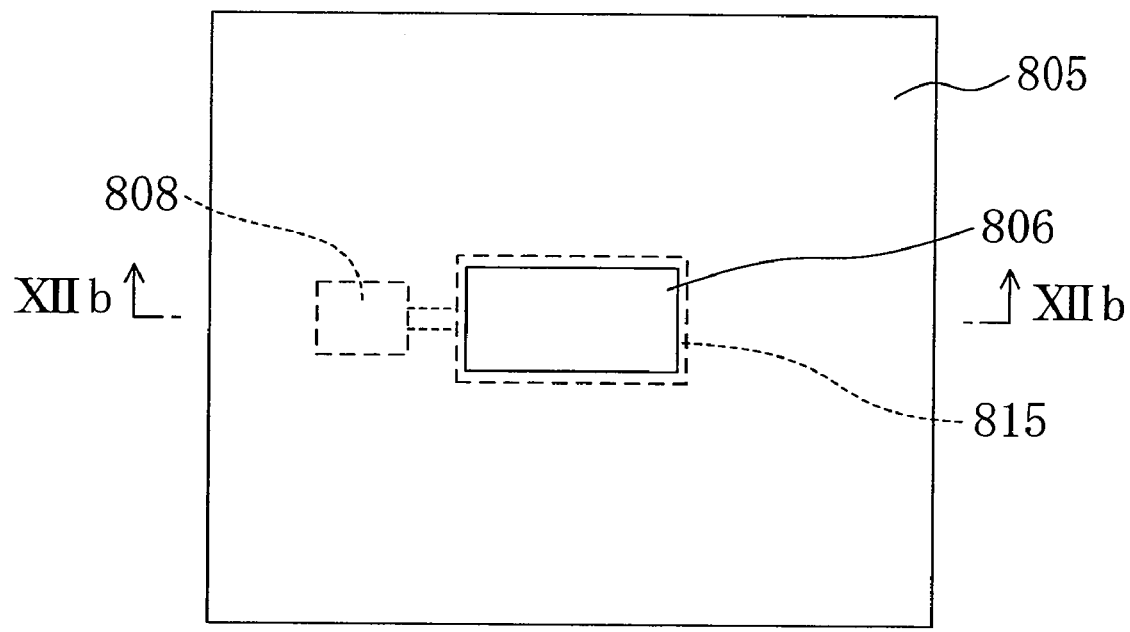
FIG. 12(a) and FIG. 12(b) show a configuration of a conventional semiconductor device.
Figure 12:
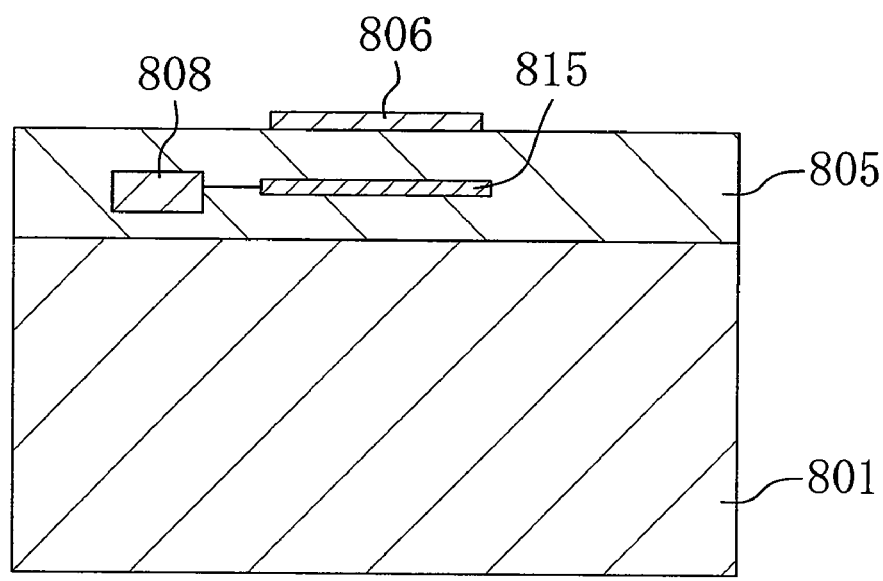

A wireless circuit device according to a fifth embodiment of the present invention will now be described with reference to FIG. 11. FIG. 11 is a block diagram showing the wireless circuit device according to the fifth embodiment of the present invention. Note that the wireless circuit device according to the fifth embodiment of the present invention is a wireless circuit device including a semiconductor device according to the present invention.

As shown in FIG. 11, the wireless circuit device of the present embodiment includes a semiconductor device including a high-frequency integrated circuit (RFIC) 606, a high-frequency amplifier (PA) 607 receiving a signal from the semiconductor device, and an antenna 608 for transmitting to outside the signal from the high-frequency amplifier 607 in the form of a radio wave. As shown in FIG. 11, the high-frequency integrated circuit 606 included in the semiconductor device includes a local oscillator (VCO) 601, a frequency divider (Divider) 602 for dividing the frequency of the signal from the local oscillator 601, a variable attenuation circuit (Variable Attenuator) 603 for attenuating the signal from the frequency divider 602, a driver amplifier (Driver) 604 for amplifying the signal from the variable attenuation circuit 603, and an electrode pad 605 for outputting the signal from the driver amplifier 604 to the high-frequency amplifier 607.

Here, for example, the electrode pad 106 of the first embodiment is used as the electrode pad 605 included in the semiconductor device. The frequency divider 602 includes a digital switch circuit.

According to the present embodiment, as in the first embodiment, it is possible to suppress the propagation of noise to the electrode pad 605 via the semiconductor substrate. That is, it is possible to suppress the propagation of the switching noise from the frequency divider 602, which includes a digital switch circuit, to the electrode pad 605 via the semiconductor substrate included in the semiconductor device. Therefore, it is possible to ensure a high signal quality, while avoiding a deterioration of the signal quality due to the switching noise (the noise signal) propagating to the electrode pad 605 to interfere with (or to be superimposed on) the signal output from the electrode pad 605. Since it is possible to sufficiently ensure an isolation between the frequency divider 602 and the electrode pad 605, the amount of attenuation of the variable attenuation circuit 603 will not be detracted from.

Moreover, since the signal output from the electrode pad 605 has a high signal quality, it is possible to provide a wireless circuit device with high reliability.

As described above, according to the present embodiment, even when the semiconductor device includes various types of signal circuits, it is possible to suppress the propagation of noise from one of the various signal circuits (e.g., a digital switch circuit) to the electrode pad via the semiconductor substrate included in the semiconductor device.

Note that although the fifth embodiment is directed to a specific example where the electrode pad 106 of the first embodiment is used as the electrode pad 605, the present invention is not limited to this, and the electrode pad of the second embodiment, the electrode pad of the third embodiment or the electrode pad of the fourth embodiment may be used.

Although the fifth embodiment is directed to a specific example where the semiconductor device includes the local oscillator 601, the frequency divider 602 including a digital switch circuit, the variable attenuation circuit 603, the driver amplifier 604, and the electrode pad 605, the present invention is not limited to this. For example, the semiconductor device may be a semiconductor device including a digital switch circuit, at least one of an attenuation circuit and an amplification circuit, and an electrode pad.

Although the fifth embodiment is directed to a specific example where the electrode pad 605 is an output electrode pad, the present invention is not limited to this, and it may be an input electrode pad.

INDUSTRIAL APPLICABILITY

As described above, the present invention can suppress the propagation of noise to the electrode pad via the semiconductor substrate, and is therefore useful as a semiconductor device in which a digital signal circuit, an analog signal circuit, a high-frequency signal circuit, etc., are integrated together.

The invention claimed is:

1. A semiconductor device comprising:
a layered region formed in a semiconductor substrate of a first conductivity type;
an electrode pad formed on the semiconductor substrate with an interlayer insulating film interposed therebetween and placed above the layered region; and
a conductive film formed in the semiconductor substrate and surrounding a periphery of the layered region, wherein
the layered region includes:
a first impurity diffusion region;
a second impurity diffusion region formed on the first impurity diffusion region; and
a third impurity diffusion region formed on the first impurity diffusion region and surrounding a periphery of the second impurity diffusion region,
a conductivity type of the first impurity diffusion region and a conductivity type of the third impurity diffusion region are a second conductivity type,
a conductivity type of the second impurity diffusion region is the first conductivity type,
an impurity concentration of the third impurity diffusion region is higher than an impurity concentration of the first impurity diffusion region, and
the third impurity diffusion region is electrically connected to a terminal fixed to a constant potential.

2. The semiconductor device of claim 1, further comprising:
a wire formed in the interlayer insulating film and electrically connected to the terminal, wherein
the third impurity diffusion region is electrically connected to the wire, and
the wire is placed in an area outside a formation area of the electrode pad.

3. A semiconductor device comprising:
a layered region formed in a semiconductor substrate of a first conductivity type;
an electrode pad formed on the semiconductor substrate with an interlayer insulating film interposed therebetween and placed above the layered region; and
an insulating film formed in the semiconductor substrate and surrounding a periphery of the layered region, wherein
the layered region includes:
a first impurity diffusion region;
a second impurity diffusion region formed on the first impurity diffusion region; and
a third impurity diffusion region formed on the first impurity diffusion region and surrounding a periphery of the second impurity diffusion region,
a conductivity type of the first impurity diffusion region and a conductivity type of the third impurity diffusion region are a second conductivity type,
a conductivity type of the second impurity diffusion region is the first conductivity type,
an impurity concentration of the third impurity diffusion region is higher than an impurity concentration of the first impurity diffusion region, and
the third impurity diffusion region is electrically connected to a terminal fixed to a constant potential.

4. The semiconductor device of claim 1, wherein the conductive film is electrically connected to a conductive film terminal fixed to a constant potential.

5. The semiconductor device of claim 4, further comprising:
a wire formed in the interlayer insulating film and electrically connected to the conductive film terminal, wherein
the conductive film is electrically connected to the wire, and
the wire is placed in an area outside a formation area of the electrode pad.

6. The semiconductor device of claim 4, wherein
a potential of the third impurity diffusion region is a first potential, and
a potential of the conductive film is a second potential different from the first potential.

7. The semiconductor device of claim 6, further comprising:
detection means for detecting a noise signal leaking from the conductive film;
control means for controlling a potential of the third impurity diffusion region to be at the first potential based on the noise signal detected by the detection means; and
control means for controlling a potential of the conductive film to be at the second potential based on the noise signal detected by the detection means.

8. The semiconductor device of claim 1, wherein the electrode pad is an input electrode pad or an output electrode pad.

9. The semiconductor device of claim 1, further comprising:
a digital switch circuit; and
an attenuation circuit, wherein
the attenuation circuit is connected downstream of the digital switch circuit, and
the electrode pad is connected downstream of the attenuation circuit.

10. The semiconductor device of claim 1, further comprising:
a digital switch circuit; and
an amplification circuit, wherein
the amplification circuit is connected downstream of the digital switch circuit, and
the electrode pad is connected downstream of the amplification circuit.

11. A wireless circuit device comprising:
the semiconductor device of claim 9;
an amplifier connected to the semiconductor device and receiving a signal from the electrode pad; and
an antenna connected to the amplifier and transmitting to outside a signal from the amplifier in the form of a radio wave.

12. A wireless circuit device comprising:
the semiconductor device of claim 10;
an amplifier connected to the semiconductor device and receiving a signal from the electrode pad; and
an antenna connected to the amplifier and transmitting to outside a signal from the amplifier in the form of a radio wave.

13. The semiconductor device of claim 3, wherein the electrode pad is an input electrode pad or an output electrode pad.

14. The semiconductor device of claim 3, further comprising:
a digital switch circuit; and
an attenuation circuit, wherein
the attenuation circuit is connected downstream of the digital switch circuit, and
the electrode pad is connected downstream of the attenuation circuit.

15. The semiconductor device of claim 3, further comprising:
- a digital switch circuit; and
- an amplification circuit, wherein
- the amplification circuit is connected downstream of the digital switch circuit, and
- the electrode pad is connected downstream of the amplification circuit.

16. A wireless circuit device comprising:
- the semiconductor device of claim 14;
- an amplifier connected to the semiconductor device and receiving a signal from the electrode pad; and
- an antenna connected to the amplifier and transmitting to outside a signal from the amplifier in the form of a radio wave.

17. A wireless circuit device comprising:
- the semiconductor device of claim 15;
- an amplifier connected to the semiconductor device and receiving a signal from the electrode pad; and
- an antenna connected to the amplifier and transmitting to outside a signal from the amplifier in the form of a radio wave.

* * * * *